United States Patent
Pace

[19]

[11] Patent Number: 6,165,820
[45] Date of Patent: Dec. 26, 2000

[54] PACKAGE FOR ELECTRONIC DEVICES

[76] Inventor: Benedict G. Pace, 2200 Smithtown Ave., Ronkonkoma, N.Y. 11779

[21] Appl. No.: 09/311,081

[22] Filed: May 13, 1999

Related U.S. Application Data

[60] Division of application No. 08/906,045, Aug. 5, 1997, Pat. No. 5,904,499, which is a continuation-in-part of application No. 08/767,160, Dec. 16, 1996, Pat. No. 5,866,441, which is a continuation of application No. 08/689,388, Aug. 12, 1996, Pat. No. 5,627,406, which is a continuation of application No. 08/361,931, Dec. 22, 1994, abandoned.

[51] Int. Cl.$^7$ .............................. B01J 31/00; B01J 37/00; C08F 4/02; C08F 4/60
[52] U.S. Cl. ......................... 438/125; 438/106; 438/107; 438/108; 438/613
[58] Field of Search .................................. 438/125, 106, 438/107, 108, 613

[56] References Cited

U.S. PATENT DOCUMENTS

| | | |
|---|---|---|
| 4,614,194 | 9/1986 | Jones et al. . |
| 4,814,295 | 3/1989 | Mehta . |
| 4,818,728 | 4/1989 | Rai et al. . |
| 4,874,721 | 10/1989 | Kimura et al. . |
| 5,111,278 | 5/1992 | Eichelberger . |
| 5,156,997 | 10/1992 | Kumar et al. . |
| 5,166,773 | 11/1992 | Temple et al. . |
| 5,216,278 | 6/1993 | Lin et al. . |
| 5,250,469 | 10/1993 | Tanaka et al. . |
| 5,252,519 | 10/1993 | Nakatani et al. . |
| 5,265,312 | 11/1993 | Nelson et al. . |
| 5,346,857 | 9/1994 | Scharr et al. . |
| 5,361,491 | 11/1994 | Oomachi et al. . |
| 5,410,451 | 4/1995 | Hawthorne et al. . |
| 5,476,818 | 12/1995 | Yanof et al. . |
| 5,672,545 | 9/1997 | Trautt et al. ............................. 437/209 |
| 5,712,192 | 1/1998 | Lewis et al. . |
| 5,904,499 | 5/1999 | Pace ........................................ 438/108 |

FOREIGN PATENT DOCUMENTS

| | | |
|---|---|---|
| 0 165 575 A2 | 12/1985 | European Pat. Off. . |
| 0 525 497 A1 | 2/1993 | European Pat. Off. . |
| 39 09 244 A1 | 9/1990 | Germany . |
| 41 29 964 A1 | 3/1993 | Germany . |
| 2 225 670 | 6/1990 | United Kingdom . |
| WO 94 18707 A1 | 8/1994 | WIPO . |

OTHER PUBLICATIONS

Yamamoto, Sugimoto, Miyake & Blankenhorn, Evaluation of New Micro–Connection System Using Microbumps, Micro–Circuits & Electronic Packaging, 15, 259–271 (1994) no month.

Matthew, Kovac, Martinez & DiStefano, Area Array Packaging, Advanced Packaging, Aug., 91–94 (1994).

DeHaven & Dietz, Controlled Collapse Chip Connection (C4)—An Enabling Technology, Proc. 1994 IEEE 44th Electronic Comp. & Tech. Conf., IEEE, Piscataway, NJ (1994) no month.

R. Tummula & E. Rymaszewski, *Microelectronics Packaging Handbook*, Van Nostrand Reinhold, NY 50–51,363–380, 1141 (1989) no month.

Balderes et al., "heat Dissipation from IC Chips Through Module Package", IBM Technical Disclosure Bulletin, V19, No.11, pp4165–4166 (Apr. 1977).

*Primary Examiner*—John F. Niebling
*Assistant Examiner*—Alexander G. Ghyka
*Attorney, Agent, or Firm*—John F. McCormack

[57] ABSTRACT

An electronic packaging module for bonding of power semiconductor devices is produced. The semiconductor device is mounted on a base, and enclosed by a frame and lid. The lid is an insulating substrate having a conductive pattern with protuberances on the conductive pattern of the substrate. The protuberances are of a soft, ductile metal capable of being metallurgically bonded to the metallization pads of semiconductor devices. The metal protuberances are bonded to the semiconductor device joining it to the lid, and through the conductive pattern of the lid connecting the device to the input/output contacts of the package.

36 Claims, 18 Drawing Sheets

PACKAGE FOR ELECTRONIC DEVICES

CROSS-REFERENCE TO RELATED APPLICATIONS

This application is a Division of Ser. No. 08/906,045, filed Aug. 5, 1997, U.S. Pat. No. 5,904,499 which is a Continuation-in-Part of Ser. No. 08/767,160, filed Dec. 16, 1996 and now U.S. Pat. No. 5,866,441, which is a Continuation of Ser. No. 08/689,388 filed Aug. 12, 1996 and now U.S. Pat. No. 5,627,406, which is a Continuation of Ser. No. 08/361,931 filed Dec. 22, 1994 and now abandoned.

FIELD OF THE INVENTION

This invention is related to the fields of ceramic chip carriers, hybrid circuits and multichip modules for electronic interconnections and chip scale packaging.

BACKGROUND OF THE INVENTION

Power semiconductor devices include power field effect transistors (FETs), insulated gate bipolar transistors (IGBTs), power transistors, power diodes, and power gallium arsenide transistors (GAs). In the past the common package for power semiconductor chips was the TO-3 can. The TO-3 package has a number of disadvantages. The wire bonds inside the package and the wires extending through the can have significant impedance the wire bonds have resistance which add to the on-resistance of the device. As chip designs have been improved to lower the resistance of the device, the resistance of the aluminum wires has become a large percentage of the total resistance of the package. The packaging efficiency of the TO-3 can is poor since the package is many times larger in surface area, volume and weight than the semiconductor chip it contains.

In the packages for logic semiconductors, the flip chip or C4 (Controlled Collapse Chip Connection) has achieved the lowest impedance by eliminating wire bonds, and the highest packaging efficiency, up to 90% for a 10 mm×10 mm die. The flip chip and C4 packages use specially prepared "bumped" chips with metallization built up on the contact pads to provide bumps for solder connection or connection by solder coated balls to the package.

Many power semiconductor chips come with a solderable back contact and aluminum metallization on the top surface. Solder can't be used on aluminum pads. Power semiconductor chips have been bumped using wire bonding machines to form multiple bumps on aluminum contact pads of the chips. A gold wire ball bond is made on the contact pad, as in conventional wire bonding, but the wire is severed at the ball bond, and the ball remains on the contact pad as a gold bump.

In one proposed package for power semiconductor chips, the chip is bonded to a metallic base; also bonded to the base is a frame which surrounds the chip. An alumina ceramic lid, provided with holes containing copper balls for contact to the chip, is bonded to the frame over the chip. The copper balls are soldered to the gold bumps on the chip and make contact through the lid to copper foils bonded to the outer alumina surface. Since the metallic base is bonded to the bottom of the frame, and the alumina lid is bonded over the top of the frame there is a height tolerance problem, because the height of the frame must compensate for any variation in flatness of the internal components of the package. To overcome this problem it has been proposed to make the alumina lid somewhat smaller than the frame and a ring of free standing copper foil between the frame and the lid would form a somewhat flexible medium to take up variations in the height of the package.

In other proposed packages, a copper foil is bonded to the wire bond gold bumps on the chip and part of the foil is formed into tabs which in one variation are insulated on one side with polyimide and then folded over to make contact with copper balls in the lid. In another variation foil tabs are bought out through the lid of the package, and the package hermetically sealed by soldering the foil tabs to copper foil lands bonded to the lid.

The mismatch of the thermal expansion coefficients of alumina and the copper foil leads to failure mechanisms that affect the adhesion of copper foil to the substrate and the hermetic seal of the package. When the copper foil is joined to the copper balls, the copper foil is deformed, stressed and thinned; it is subject to the further stress of thermal mismatch leading to breaks and stress corrosion.

Miniature flexible circuits have been designed to provide packaging efficiencies similar to the C4 process. The flexible circuits can be used with conventional integrated circuits having perimeter contacts. Gold conductors of the flexible circuit are thermosonically bonded the integrated circuits contacts. The conductors of the flexible circuit don't fan out from the integrated circuit contacts into the area around the chip, instead the conductors fan in underneath the chip terminating in a grid array of metal bumps underneath the chip for interconnection to second level packaging. The flexible circuit is bonded to the chip with an elastomeric adhesive 0.15 mm (6 mil) thick. The organic elastomeric adhesive and flexible circuit materials limit the temperature range in manufacture and use, do not permit good thermal transfer, make the package sensitive to moisture, and prevent use as hermetically sealed packages.

SUMMARY OF THE INVENTION

In one embodiment the invention is an improvement in the method of packaging a power semiconductor chip wherein a first surface of the chip is bonded to a base and a frame is attached to a lid and the base to enclose the chip. The chip has at least one power contact pad on its second surface which is attached to the lid. The improvement in the packaging method comprises: providing a planar, insulating substrate as the lid, which has at least one conductive pattern layer on a first surface facing the chip; forming at least one soft, ductile, metal protuberance on at least one conductor of the conductive pattern layer on the first surface the lid, and connecting the conductive pattern of the lid to the chip by metallurgically bonding the protuberances to contact pads of the chip, the number of protuberances bonded to a power contact pad being sufficient to minimize the contact resistance, the current density on the surface of the chip and the power lost as heat ($I^2R$) between the chip and the lid.

In another embodiment the invention is a package for a semiconductor chip having at least one power semiconductor. A first surface of the chip is bonded to a base; a frame attached to a lid, and the base is attached to the frame to enclose the chip. The chip has at least one power contact pad on its second surface. This embodiment is characterized in that the lid comprises an insulating substrate having a conductive pattern at least on a first surface facing the chip, the conductive pattern of the lid being connected to the chip through of soft, ductile, metal protuberances protruding from the conductive pattern layer on the surface the lid facing the chip.

In yet another embodiment the invention is a packaging module for a plurality of power semiconductor devices.

Each power semiconductor chip has at least one power semiconductor thereon. A first surface of each chip is bonded to a base, and a second surface of each chip has at least one power contact pad. Each chip is surrounded by a frame. All the frames that surround each chip are bonded to a common lid, and the base supporting each chip is bonded to a frame. The common lid is a planar, insulating substrate, and the area of the lid is large enough to accommodate all the chips. There is a conductive pattern on the insulating substrate of the lid. At least one conductive pattern layer on a first surface of the lid has a plurality of soft, ductile metal protuberances and the conductive pattern of the lid is metallurgically bonded by the protuberances to each of the contact pads on second surfaces of the chips.

In yet another embodiment, the invention is a compact, light weight package for power semiconductor devices with a built-in thermally conductive interface and high packaging efficiency.

In another embodiment, the invention is a compact, light weight package for an array of power semiconductor devices. The array of power semiconductor devices can be electrically interconnected or independent.

In yet another embodiment, the electronic packaging module is a SCM, single chip module with high packaging efficiency. The high packaging efficiency arises since the SCM may be less than 6 mm (0.15 in.) wider than the bare integrated circuit die. The SCM is composed of a planar lid with conductive feed-throughs in the lid. On one side of the lid the conductive feed-throughs are joined to at least one conductive pattern layer for connection to the next level package. On the other side the feed-throughs are connected to at least one conductive pattern layer. The conductive pattern layers are separated by insulating layers. At least one insulating layer has metal filled openings in it. The metal in the openings connects to an underlying conductive pattern layer below, and terminates above in soft, ductile metal protuberances protruding above the topmost the insulating layer. The protuberances are metallurgically bonded to the input/output pads of a semiconductor device or integrated circuit die. The semiconductor device is connected through the protuberances and the conductive pattern of the module and the feed-throughs of the substrate to metal contacts on the other side of the lid.

DETAILED DESCRIPTION OF THE INVENTION

Figure 1:
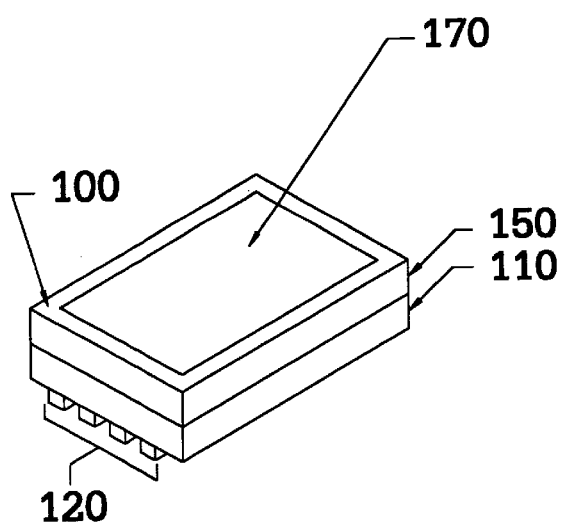
FIG. 1 is view of a SCM, single circuit module according to this invention.

This invention relates to first level electronic packaging for semiconductor devices, integrated circuits, application specific integrated circuits (ASICs) and power semiconductors, including power diodes, power field effect transistors (FETs) and power metal oxide field effect transistors (MOSFETs), bipolar power transistors and integral gate bipolar transistors (IGBTs), silicon controlled rectifiers (SCRs).

The electronic packages have planar, insulating substrates. Ceramic substrates comprising aluminum oxide, aluminum nitride, beryllium oxide, boron nitride, cordierite, mullite, silicon carbide and silicon nitride are suitable. Especially suitable are substrates whose thermal expansion characteristics are closely matched to that of the semiconductor devices such as silicon, sapphire and glass/ceramics comprising aluminum oxide, aluminum nitride, beryllium oxide, boron nitride, cordierite, mullite, silicon carbide and silicon nitride.

The conductive patterns of the electronic packages may be prepared using the sputtered metal and high polymer dielectrics characteristic of the MCM-D (Multichip Module-Deposited) technique, but thick or thin film metallization, and fired, inorganic dielectrics are preferred.

An important feature of the invention is the formation of metal protuberances on the package joined to the conductive pattern and capable of being metallurgically bonded to the input/output pads of a semiconductor device (including integrated circuits and ASICs). The metal protuberances may be simultaneously bonded to the input/output pads of a semiconductor device, which is a simpler and faster process than the conventional, sequential wire bonding process. The substrates, "bumped" with metal protuberances in a simple process, are more economical, easier to prepare, and to use than the bumped chips common in "flip chip" technology.

The metal protuberances should be high enough above the surface of the electronic package to form a reliable metallurgical bond with the input/output pads of the semiconductor device. The protuberances should be greater than 5 $\mu$m high, and preferably greater than 10 $\mu$m. The protuberances must be high enough to compensate for the variations due to the camber, planarity and overall size of the both the electronic package and the device, and not so high that they collapse and short circuit in the bonding process. On 96% alumina substrates, protuberances as low as 25 $\mu$m are effective in bonding semiconductor devices with length and breadth up to 5 mm, and protuberances up to 150 $\mu$m are also effective. Smaller protuberances are effective on flatter substrates such as polished 99% alumina ceramics. Still smaller protuberances are effective for still flatter surfaces such as silicon wafers.

The input/output pads of such semiconductor devices are commonly metallized with aluminum or gold. The metal protuberances are capable of metallurgically bonding to the pads by thermocompression, thermosonic or ultrasonic means, or by soldering.

The metal of the metal protuberances is selected from the group comprising aluminum, copper, gold, indium, lead, silver, tin combinations and alloys of these metals.

Aluminum or gold protuberances are preferred when the metallization of the input/output pads of the semiconductor device is aluminum. Aluminum protuberances are formed by vacuum deposition of aluminum through a shadow mask. Gold protuberances are preferably formed by electrodeposition or electroless deposition. The protuberances can be formed by deposition of metal onto the conductive pattern through openings in a temporary and/or permanent mask which is over the pattern. The metallurgical bonds between the gold protuberances and the pads can be formed by thermocompression, thermosonic or ultrasonic bonding. Gold protuberances are also suitable for when the metallization of the semiconductor input/output is gold. For thermocompression, thermosonic or ultrasonic bonding the metal protuberances should be soft, and ductile.

Indium metal protuberances are suitable for forming metallurgical bonds to gold metallization on the input/output pads. The metal protuberances also may be lead/indium or tin/indium alloys. The alloy metal protuberances are preferably overplated with a layer of pure indium. Indium and indium coated protuberances may be metallurgically bonded to the input/output pads of the semiconductor devices by an indium fusing or soldering process.

According to the teachings contained herein a power semiconductor can be packaged with the back side of the power die brazed to a metal base or tab and the other side of the die joined by a plurality of metal protuberances to a metallic conductive pattern. The metal base on one side and the sea of bumps on the other permit heat to be withdrawn from the power die from both sides of the package.

In one embodiment the invention, shown in FIG. 1, is a compact, ceramic, chip carrier or SCM, single chip module, 100 with high packaging efficiency. The SCM has a conductive pattern on a ceramic substrate 110 as a base. The base has area array contacts 120 for interconnection to second level packaging and a metal or ceramic frame 150 around the semiconductor device or integrated circuit chip. The area array of contacts may be an irregular array or a regular array such as a ball, pin, pad or column array. A metal or ceramic plug 170 is brazed to the frame to seal the module.

Figure 2:
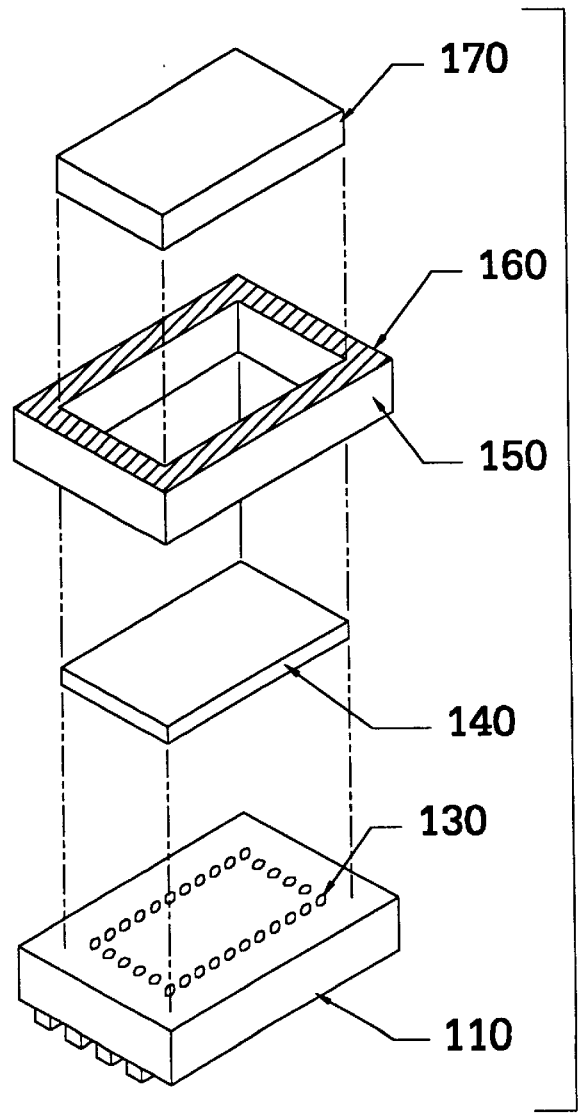
FIG. 2 is an exploded view of the SCM of FIG. 1.

In FIG. 2 the components of the module are shown. The hybrid circuit base 110 has protuberances 130 of a soft, ductile metal. The soft, ductile metal of the protuberances is capable of metallurgically bonding to the IOs, input/output contacts, of a semiconductor device or integrated circuit chip. A semiconductor device 140 is inverted for bonding so that the IOs face the protuberances on the hybrid circuit base. The IO contacts of the device are joined to the soft, ductile, metal protuberances of the hybrid circuit base by soldering or thermocompression, ultrasonic or thermosonic bonding. The IO contacts are then interconnected by the hybrid circuit conductive pattern to the area grid array.

The frame of the module 150 has a wall thickness of 0.4–1 mm (15–40 mils). The frame fits closely around the integrated circuit die, so that the overall module (FIG. 1, 100) is only 1.0–3.8 mm (40–150 mils) bigger than the die. For hermetically sealed modules, the frame is made of ceramic or metal. Ceramic frames are glass bonded to the base, and metal frames are brazed. A ceramic frame will preferably be metallized on its upper surface 160 for brazing to the metal plug.

The plug 170 is inside the frame preferably making contact with the back of the integrated circuit chip. When efficient removal of heat from the integrated circuit chip is required the plug is preferably made of metal or a heat conductive ceramic. Also, the plug preferably is made of an material that matches the thermal expansion of the base and the frame such as a copper/tungsten, nickel/cobalt/iron alloy or beryllia. The plug is soldered or bonded to the frame to seal the module.

When heat removal is not a serious problem, or the heat is removed through the module base, the frame may be closed with a cover that is not in contact with the chip.

When hermetic sealing is not required the integrated circuit may be sealed by molded plastic or a plastic enclosure adhesively bonded to the base, e.g., with an epoxy adhesive.

The embodiments shown in FIGS. 1, and 2 as SCMs (Single Chip Modules) provide a rugged package for full functional testing and/or burn-in of integrated circuits. After the testing and/or burn-in that provides known good die (KGD), the SCM can be mounted in a multichip package with packaging efficiency approaching or exceeding that of a wire-bonded chip.

When SCM packages are sealed or encapsulated in plastic, or hermetically sealed, the length and breadth of the base 110 of the SCM package may be as small as 1.6 mm (40 mils) greater than the length and breadth of the die. Preferably the base is smaller than 6 mm (150 mils) greater than the length and breadth of the die, and more preferably as small as 2.75 mm (70 mils) greater than the length and breadth of the die.

The highest packaging efficiency, and the smallest single chip package for testing and/or burn-in to obtain known good die (KGB), is achieved when the length and breadth of the base 110 are only 0.25 mm greater than, or even the same as, the length and breadth of the die. In this embodiment of the invention, the SCM is not encapsulated in plastic or hermetically sealed with the frame 150 and plug 170. The bond of the device to substrate can be further enhanced by a organic or inorganic adhesive means. The SCM comprises only the base 110 having a conductive pattern and conductive feed-throughs to grid array contacts, and the die 140 metallurgically bonded to metal protuberances 130. After testing and/or burn-in to verify a KGD, SCM may be subsequently mounted in a multichip module, and the whole multichip module sealed by encapsulating in plastic or in a hermetically sealed package.

Figure 3:
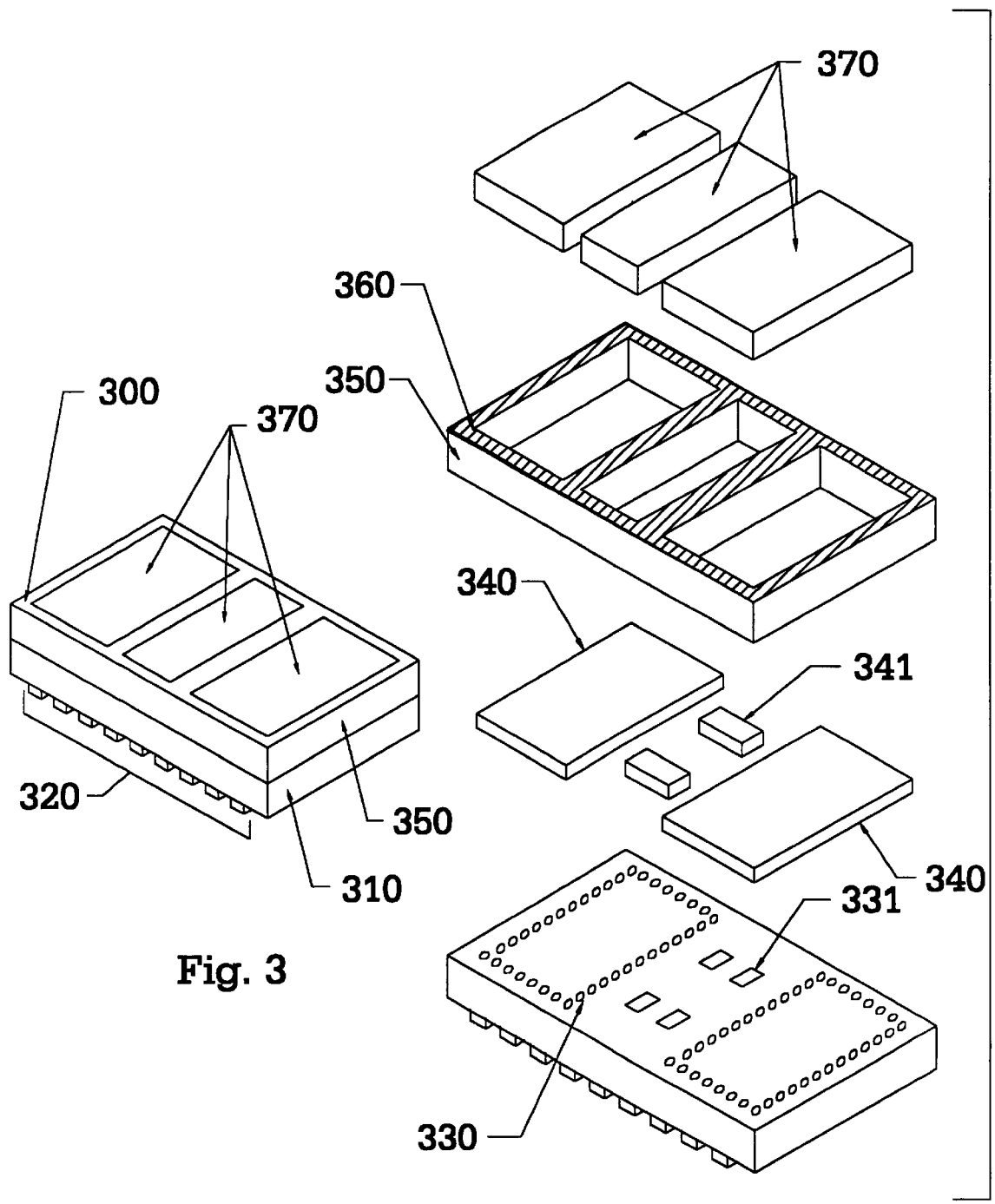
FIG. 3 is a view of a MCM, multichip module according to this invention.

A MCM, multichip module, embodiment of the invention is shown in FIG. 3. The MCM 300 also has a high packaging efficiency. The MCM has a ceramic, hybrid circuit 310 as a base. The base has area array contacts 320 for interconnection to second level packaging and a metal or ceramic frame 350 around the integrated circuit chips and other components. Metal or ceramic plugs 370 are brazed to the frame to seal the module.

Figure 4:
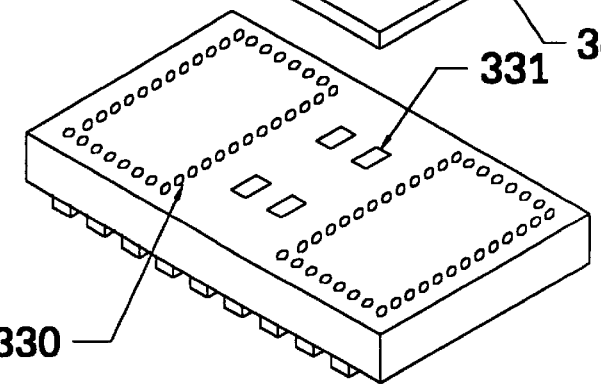
FIG. 4 is and exploded view of the MCM of FIG. 3.

In FIG. 4 the components of the module are shown. The hybrid circuit base 310 has metallic pads 331 for bonding chip capacitors or other components. The hybrid circuit also has protuberances 330 of a soft, ductile metal. The soft, ductile metal of the protuberances is capable of metallurgically bonding to the IOs, input/output contacts, of a semiconductor device or integrated circuit chip. Semiconductor devices 340 and other components 341 are bonded in place. The devices and the other components are interconnected by the hybrid circuit conductive pattern, and connected by the hybrid circuit pattern to the area grid array.

The frame of the module 350 has a minimum wall thickness of 0.4 mm (15 mils). The frame fits closely around the integrated circuit dice and the other components, so that the overall module (FIG. 3, 300) has a high packaging efficiency. For hermetically sealed modules, the frame is made of ceramic or metal. A ceramic frame will preferably be metallized on its upper surface 360 for soldering to the metal plugs.

The plugs 370 fit inside the frame and contact the back of the integrated circuit chips in order to efficiently remove heat from the integrated circuit. The plugs are soldered or bonded to the frame to seal the module.

It will be obvious to those skilled in the art, that, since the chip is against the top of the package, heat sinks, heat exchangers or chill plates mounted on the top of the package will be a more efficient way to remove heat than in conventional "cavity up" packages where the heat has to be removed through the substrate into the next level package, e.g., a printed circuit board.

When heat removal is not a serious problem, or the heat is removed through the module base, the frame may be closed with a cover that is not in contact with the chip.

When hermetic sealing is not required the package may be sealed by molded plastic or a plastic enclosure adhesively bonded to the base, e.g., with an epoxy adhesive.

A disclosure of the steps of the process for manufacturing a single chip or multichip module is presented in FIGS. 5a–5h.

A planar substrate 510 provided with conductive feed-throughs 520, 521 and terminals 522 for connection to the next level of electronic packaging is illustrated in FIG. 5a. Any suitable electronic insulating material may be used for the substrate 510. Suitable materials include silicon, sapphire and ceramics and glass/ceramics comprising alumina, mullite, cordierite, beryllia, aluminum nitride, boron nitride, silicon nitride, silicon carbide and silicon carbide with a small percentage of beryllia.

The feed-throughs 520 and 521 should have good conductivity and preferably maintain a hermetic seal. Refractive metal feed-throughs of tungsten or molybdenum prepared by the co-firing metal pastes in green ceramics provide hermetic feed-throughs.

The feed-throughs are usually arranged in a grid array, but they can be arranged in any convenient pattern. The pad pitch in the grid array may be 0.15–2.5 mm (6–100 mils) as required. A pad pitch between 0.25 and 0.5 mm (10–20 mils) is preferred for SCMs (single circuit modules); a 0.25–1.3 mm (10–50 mils) pad pitch is preferred for MCMs, and 1.3–2.5 mm (50–100 mils) pad pitch is preferred for pin grid arrays. Pins may be attached to the feed-throughs to provide a pin gird array.

A metal layer 513 is applied over the substrate as shown in FIG. 5b.

In one embodiment a layer of thick film metallic paste is applied over the surface of a ceramic substrate. The paste layer may cover the complete planar surface, or only a portion of the surface where metal conductors are required. The metallic paste may be selected from thick film conductor pastes containing copper, gold, platinum, palladium, silver or mixtures and alloys thereof. Copper and gold conductor pastes are preferred. One suitable gold contains 88% gold, 3–4% glass with 8–9% organic binder of ethyl cellulose and terpineol. A suitable copper paste is C7230™ Copper Conductor Paste commercially available from Heraeus Inc., Cermalloy Div., West Conshohocken, Pa. 19428.

The paste on the substrate is dried and fired to convert it to a metallic layer 513. A gold paste is fired in air and a copper paste is fired in a nitrogen atmosphere, both at 850° C. The metal layer is preferably 8–12 $\mu$m thick after firing.

Alternatively, the metal layer 513 may be deposited by a thin film technique. A suitable thin film metallization has a bonding layer of titanium/tungsten or chromium and 1–5 $\mu$m (40–200 microinches) of copper or gold.

FIG. 5c shows the production of a first conductive pattern layer 514 on the substrate 510. The first conductive pattern layer 514 is shown as an interdigitated voltage and ground plane. The conductive pattern is produced by the procedures of copending U.S. patent application Ser. No. 08/171,696, now U.S. Pat. No. 5,378,313, which is incorporated herein by reference.

An etch resistant image of the first conductive pattern layer is printed over the metal layer with a photoresist. Any photoresist, positive or negative acting, may be used provided it is not soluble in the etchant chosen, has good adhesion to the metal layer, and is capable of resolving 10 $\mu$m lines and spaces. One suitable photoresist is AZ 4210™ available from American Hoechst, Branchberg, N.J. The etch resist image leaves exposed a ring isolating each of the feed-throughs that should not be connected to the voltage/ground plane. The portion of the metal layer not covered by resist is etched away. A suitable etchant must remove all traces of the metal between the conductors without serious undercut the conductor edges. A suitable etchant for a gold layer is iodine in an aqueous solution of potassium iodide such as CGE-100™ from Micro Pac Co., Garland, Tex. Suitable copper etchants include sodium or ammonium peroxydisulfate solutions at 120–250 g/l, copper (II) chloride at 75–200 g/l, hydrogen peroxide 1–1.5 m/l in 1.5–3 molar sulfuric acid, 0.5–1.5 copper ammonium chloride at a pH of 8–9, and 30–48°Bé ferric chloride with 0.1 to 1.2 m/l hydrochloric acid. Copper etchants are used at temperatures between 15–50° C. depending on the copper paste and etching solution used.

After etching the etch resist is stripped leaving the voltage/ground plane pierced by rings around the feed-throughs for the signal planes. Feed-throughs 521 which make connection to the signal planes are isolated from the voltage and ground plane by insulating rings 515. The rings should isolate the voltage or power grids from the feed-throughs by at least 25 $\mu$m (1 mil), preferably by at least 50 $\mu$m (2 mils), and more preferably by 125 $\mu$m (5 mils). Feed-throughs 520 are voltage and ground connections and are not surrounded by an insulating ring.

A dielectric layer 516 is applied over the conductive pattern layer 514 as shown in FIG. 5d. The dielectric may be an organic dielectric or an inorganic dielectric such as a silica or thick film dielectric.

Thick film dielectric layers are formed by coating the conductive pattern layer 514 with a dielectric composition and firing to fuse the dielectric layer. The dielectric layer may be applied by any convenient technique, screen printing, roller coating, doctor blade or as a dry, green film. No dielectric vias need be printed or formed before firing the dielectric. Suitable dielectrics may be selected by methods described in copending U.S. patent application Ser. No. 08/171,696, now U.S. Pat. No. 5,378,313. In order to avoid pinholes in the dielectric layer, especially screen printed dielectric layers, preferably two applications and firings are made of the dielectric composition. Additional coatings and firings may be used as long as the overall thickness of the dielectric layer is not so great that the laser energy required to form a via would damage or destroy the underlying conductor. Preferably the dielectric layer will be at least 10 $\mu$m (0.4 mils) thick, more preferably 20 $\mu$m thick.

Openings 517 in the dielectric, to accommodate vias between layers, are formed by laser ablation through the dielectric layer. The laser energy is controlled to prevent damage or destruction of the underlying conductors. The quantity of laser energy required, which varies with the composition and thickness of the dielectric layer, can be determined empirically. No via artmaster is required. The X-Y coordinates of the vias are fed to the laser controller. The openings can have a diameter between 10–150 $\mu$m (0.4–6 mils) depending on the pitch needed for the conductive pattern.

Many commercially available thick film pastes are suitable for forming the dielectric layer. One suitable screen printable dielectric composition is CERMALLOY IP-9117™ from Heraeus Inc., West Conshohocken, Pa. 19428. The fired dielectric layer must be capable of maintaining its shape without reflow after laser ablation or after firing of subsequent layers. The dielectric layer must absorb the laser energy and form clean vias through the layer with minimum damage or penetration of the underlying conductor. Dielectric compositions which do not efficiently absorb the laser beam require high laser energy that either penetrates through the underlying conductor layer, cracks, burns or blisters the dielectric layer around the via, or forms an elevated ridge around the via.

In one alternative procedure, the conductive pattern layer 514 is coated with a polymer such as polyimide or polybenzocyclobutane forming the dielectric layer 516, and the openings 517 are laser ablated, or photoimaged in the polymer before crosslinking the polymer. In another alternative procedure the conductive pattern layer is coated with a silica as the dielectric layer 516. The openings 517 are laser ablated, or the silica dielectric is covered with a mask, and the openings 517 are formed by chemical or plasma etching.

A second, metal layer is applied that covers the dielectric layer 516 and fills the openings. The second, metal layer may also be a either a thick film or thin film metal layer when the dielectric layer is a fired, inorganic layer. The second, metal layer is a sputtered or vacuum deposited metal when the dielectric layer is a polymer or silica dielectric.

A photoresist image of the X-signal plane is applied to the second layer, and a second, conductive pattern layer 518 is formed by etching. The minimum conductor width will be at least 10 µm (0.4 mil). The minimum spacing between conductors will be at least 10 µm. Preferably the minimum conductor line width and spacing will be 60 µm (2.4 mils).

The second, conductive pattern layer is then covered with a second, dielectric layer. Openings are made in the dielectric layer, and a third, metal layer is applied. The third, metal layer makes connections to the X-signal, conductive pattern layer through the openings as shown in FIG. 5e.

Figure 5:
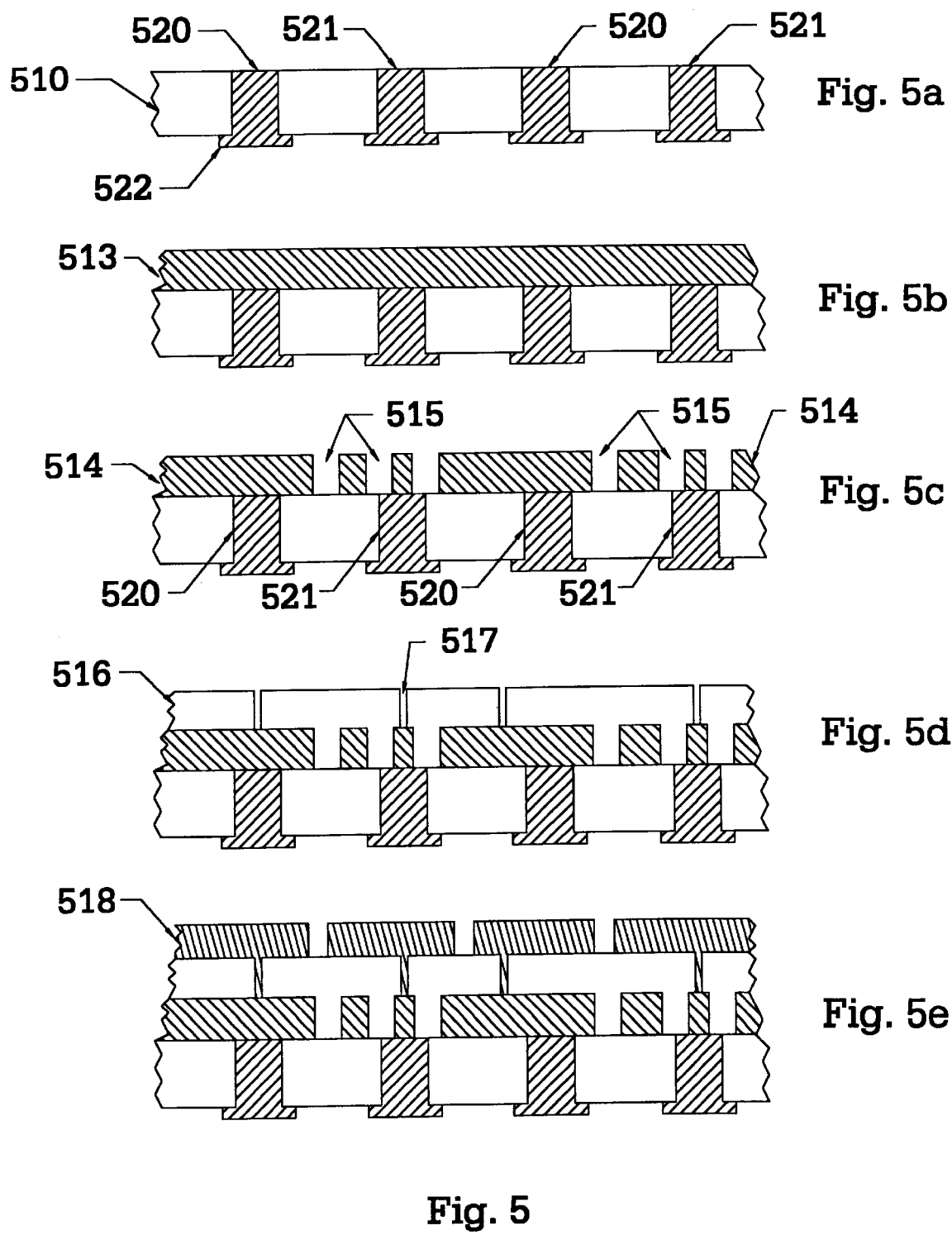
FIGS. 5a–5h illustrates the steps in preparing a module according to this invention.
Figure 5F:
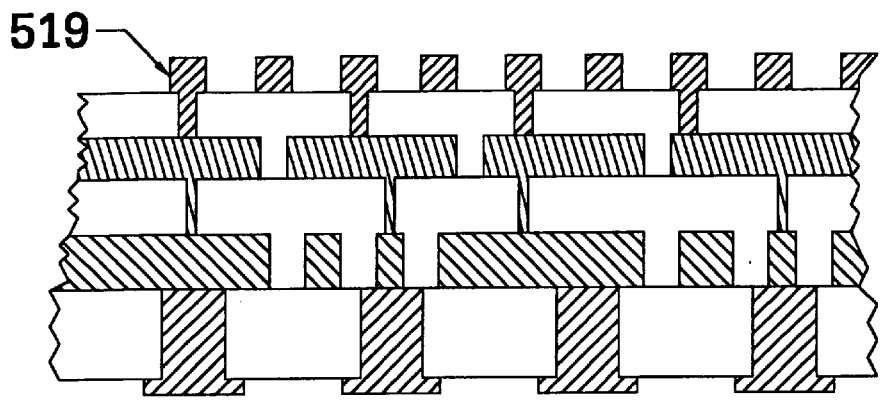

In FIG. 5f a third, conductive pattern layer 519, the Y-signal plane, is shown. The Y-signal, conductive pattern layer is formed from the third conductive metal layer by photolithography.

A third, dielectric layer is applied over Y-signal, conductive pattern layer. Openings to the Y-signal, conductive pattern layer are made through the dielectric layer. The openings have a diameter at least 10 µm (0.4 mils) and less than 150 µm (6 mils), preferably at least 25 µm (1 mil) and preferably less than 75 µm (3 mils). The pitch of the openings matches the pitch of the IOs (input/output pads) of the integrated circuits, and the pattern of the openings makes a mirror image of the IO pad pattern of the integrated circuit. The openings are filled with a pure, soft, ductile metal. The metal should be soft enough to permit simultaneously welding of the protuberances to the input/output pads of the integrated circuit die without requiring welding pressures so high as to damage the die. Soft, ductile gold is deposited by electroplating or electroless plating. The softness of the gold is dictated by the pressure required to thermocompression, thermosonically or ultrasonically bond to the die. If the pressure is too great it may damage the die. Large dice with many input/output pads require softer gold to minimize gang bonding pressure and reduce the stress on the die. A suitable gold is produced by the Aurall™ 292 Gold Process, available from LeaRonal Inc., Freeport, N.Y. 11520, USA. The Aurall 292 Gold Process uses a electroplating solution containing 8–16 g/l gold at a pH between 6 and 8, and is believed to contain a phosphonate chelating agent.

Figure 5G:
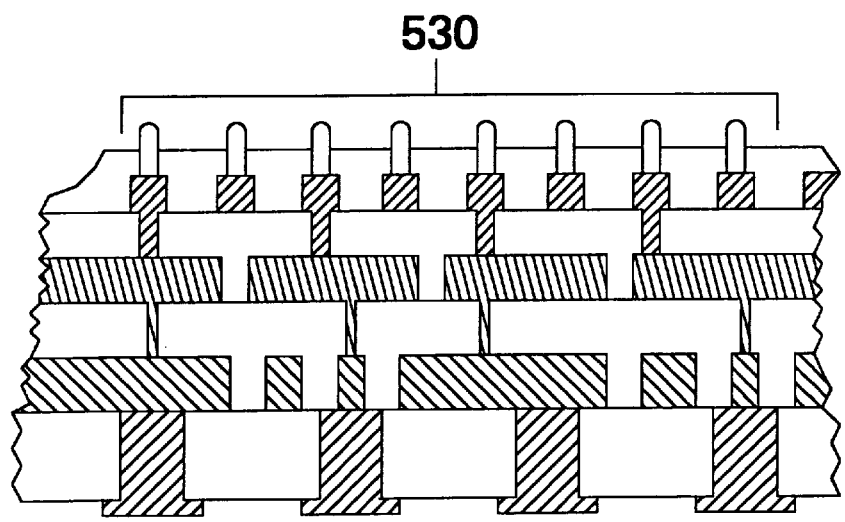

As shown in FIG. 5g the metal is deposited to fill the openings and form hemispherical protuberances 530 over the openings that are 10–80 µm (0.4–3 mils) high.

In order to prevent lateral growth of gold deposits, the plating conditions must be tightly controlled. For example, to obtain uniform gold protuberances using the Aurall 292 Gold Process the pH is maintained at 6.8–7.2, the current density is 0.72 amps/dm$^2$, the solution temperature is 26–40° C. (preferably 29–31° C.), and the solution is stirred strongly. If, in this plating solution, the temperature is too high, there is excessive lateral growth; if the temperature is too low, the gold deposit becomes nodular.

In an alternative procedure, the third, dielectric layer is a temporary resist. The openings in the third dielectric layer are made by laser ablation or photoimaging and the temporary resist is stripped after forming the protuberances 530.

Figure 5H:
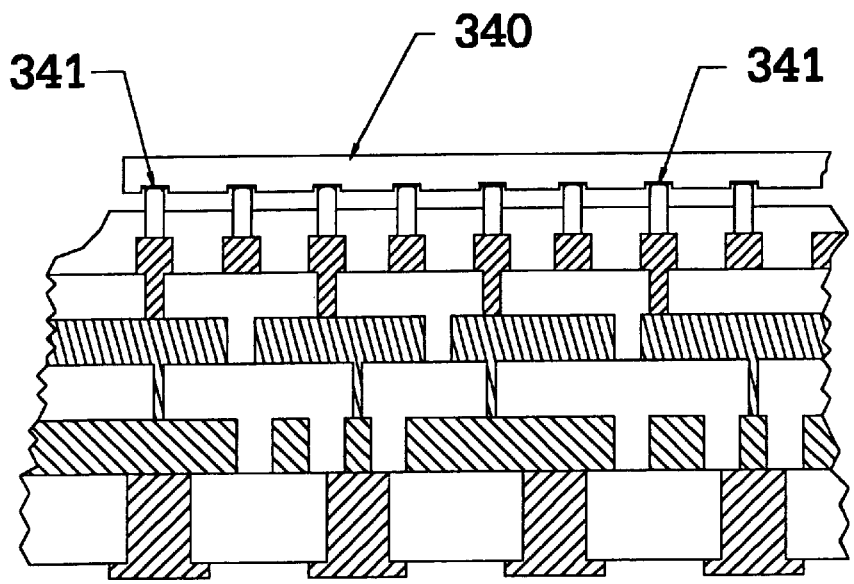

FIG. 5h illustrates an integrated circuit chip 540 having gold or aluminum bonding pads 541 being inverted and placed over the module with the bonding pads in position over the protuberances 530, and the all the chip bonding pads simultaneously thermocompression bonded to the module. C4 integrated circuits with Pb/Sn alloys on the IO pads may also be bonded in a similar manner to the single chip and multichip modules of this invention.

In the final operations (not shown) the module is sealed by applying a frame and a cover or a frame and plug(s) to the module.

In yet another embodiment, the invention comprises a standardized ceramic substrate having cofired refractory metal feed-throughs in a standard area array pattern. A particular conductive pattern may not use all of the feed-throughs. The standard substrate is customized for a particular pattern by isolating the inactive feed-throughs with an insulating layer. The first conductive pattern layer may be formed on the substrate, and the inactive feed-throughs isolated by the first insulating layer. Alternately the substrate and the feed-throughs first are coated with an insulating layer, and openings laser drilled though the insulating layer exposing the feed-throughs that are required by the customized pattern. The conductive pattern is then applied as described above, the first metallization layer making contact through the openings to the required feed-throughs.

In another embodiment, SCM and MCM packages are provided with "Flat Pack" termination for attachment to the next level package, e.g., a printed circuit board. Flat pack metal contacts maybe positioned on either the upper or lower surface of the SCM or MCM packages.

When the flat pack metal contacts are positioned on the upper surface of the package, a planar, insulating substrate is provided for the flat pack module. A layer of thin film or thick film metallization is applied to the substrate.

For thick film metallization, a thick film conductor paste may be screen printed on the substrate. The contacts for brazing or soldering of flat pack leads are applied before the thick film metallization layer when refractory metal contacts are used. Platinum/gold or palladium/silver contacts may be applied before or after thick film metallization. The contact pattern is printed around the perimeter of conductive pattern using a paste suitable for brazed or soldered connections such as a refractory metal paste, a palladium/silver or a platinum/gold paste. The thick film metallization is completed by drying and firing the conductor paste on the substrate.

A photoresist is coated over the metal layer. A photoresist image with minimum lines and spaces between 10 µm and 150 µm wide (0.4–6 mils), and corresponding to the conductive pattern of the first layer of a hybrid circuit is printed and developed on the metal layer. The metal not protected by the resist image is etched away. The photoresist is stripped off leaving a metallic conductive pattern. For substrates coated with thin film metallization the etched conductive pattern includes contacts for subsequent brazing or soldering of flat pack leads.

The screen printed contacts slightly overlap selected conductors of the metal conductive pattern.

A thick film dielectric paste is screen printed over the metal conductive pattern. The dielectric paste is printed and fired at least two times to give a dielectric layer approximately 8–12 µm thick.

Laser drilled openings are formed in the dielectric layer. The opening diameters are between 10–150 µm (0.4–6 mils). No via artmaster is required, since the positions of all the openings are computed by the design software which was used to drive the laser.

A second layer of metallic conductive paste is printed and fired over the dielectric layer. The metal fills the openings making contact to the first conductive pattern layer. The second conductive pattern layer is formed from the second metal layer by the photolithographic technique described above.

A second dielectric layer is formed over the second conductive pattern layer by the procedure described above. Laser ablated openings are drilled through the second dielectric layer to the second conductive pattern layer below.

Additional conductive pattern layers may applied as required. Each conductive pattern layer is covered by a thick film dielectric layer. Openings to the previously applied conductive pattern layer are made through the dielectric layer by laser drilling.

The final conductive pattern layer also is coated with a dielectric layer. Laser ablated openings to the final conductive pattern layer are made in the dielectric layer. The openings have a diameter between 10 µm (0.4 mils) and 150 µm (6 mils), preferably between 25 µm and 75 µm (1 mil and 3 mils). The pitch of the openings matches the pitch of the IOs (input/output pads) of the semiconductor devices. The openings are electroplated or electrolessly plated with a soft, ductile metal that fills the openings and forms protuberances over the openings that are 10–80 µm (0.4–3 mils) high.

Flat pack leads are brazed, soldered, thermocompression bonded or welded onto the contacts.

One or more semiconductor devices having gold or aluminum bonding pads are placed over the module with the bonding pads in position over the metal protuberances and the all the chip bonding pads are simultaneously metallurgically bonded to the module. The conductive pattern and the semiconductor device(s) are sealed by encapsulating in plastic, or by enclosing in a plastic, metal or ceramic enclosure.

Flat pack packages with the flat pack contact mounted on the lower surface of the SCM or MCM offer higher packaging efficiency. A substrate with conductive feed-throughs is used. The conductive pattern is connected to the conductive feed-throughs as shown in FIGS. 1–5. On the other side of the substrate, opposite the conductive pattern, a fan out pattern is provided which fans out from the feed-throughs to the periphery of the substrate. The flat pack contacts are brazed to the fan out pattern on the periphery. With the flat pack contacts underneath the substrate rather than on the top, the dimensions of the package can be reduced by the area required to braze the flat pack connections on a top surface.

The electronic packages and packaging techniques described herein are capable of connecting not only an integrated circuit die with perimeter IO's, but also an integrated circuit die with IO's in an array across the die. Such arrays are commonly used for C4 connections and are proposed for integrated circuits having IO counts too large to be accommodated on the perimeter of the die.

Packages for power semiconductor chips described herein have three parts: the chip bonded to a base, an insulating substrate as a lid, and a frame bonded to the base and lid and surrounding the chip. Preferably the base is a material capable of conducting heat away from the chip, such as a metal or a heat conducting ceramic such as beryllia or alumina. Preferably the thermal coefficient of expansion of the base will be close to that of the chip. The lid will comprise a conductive pattern including the metal protuberances which are metallurgically bonded to the contact pads of the chip. Often the lid will have a plurality of protuberances contacting each of the large contact pads on the chip.

Before joining the chip to the lid the protuberances may vary in height. In addition there may be variations in the planarity and camber of the base, chip and lid. In the process of metallurgically bonding the chip to the protuberances of the lid, the soft, ductile metal of the protuberances flows slightly compensating for these variations and producing uniform bonding to the chip. During the process of metallurgically bonding the protuberances to the chip, it is important the chip be free to move toward the lid to take up the variations.

Assembly of the package is easy when the frame encloses the chip during the process of bonding the protuberances to the chip. The chip is bonded to the base before assembling the package. In one embodiment of the assembly process, the frame is bonded to the lid and the base is slightly smaller than the frame, the base with the chip attached freely adjusts against the protuberances of the lid during bonding, e.g. thermocompression bonding. Preferably the outside dimensions of the base would be 2 mm (50 mils) smaller than the inside dimensions of the frame. In a second embodiment the frame is bonded to the base, and the lid is slightly smaller than the frame permitting adjustment during bonding of the protuberances to the chip. Preferably the outside dimensions of the lid would be 2 mm (50 mils) smaller than the inside dimensions of the frame. In a third embodiment the frame is slightly larger than both the lid and the base, to the base and lid can freely move inside the frame.

After the protuberances are bonded to the chip, compressing force is maintained while the base, lid and frame are metallurgically or adhesively joined together. Thus the package is sealed in compression, which reinforces the bond between the lid and the chip. This provides a long lived package having greatly enhanced reliability without the need for the organic "underfill" adhesive that is frequently used in flip chip and C4 packages to reinforce the metallurgical bonds to the contacts.

Where the service conditions for the package permit, a plastic frame or enclosure may be used. The base and the lid are then adhesively bonded to the frame, e.g. with an epoxy adhesive. In an alternative approach, the frame is formed by molding plastic around the chip, sealing the chip between the lid and the base. Organic "underfill" adhesives may be used.

The preparation of a package for a power semiconductor device is illustrated in FIGS. 6a–6h. The package was prepared for an IRFC-150™, a power field effect transistor (FET), available from the International Rectifier Corp. The IRFC-150 semiconductor die was a square piece of silicon 6.55 mm (258 mils) on a side and 0.38 mm (15 mils) thick. The drain is the back of the die and the source and gate are on the top surface.

Figure 6A:
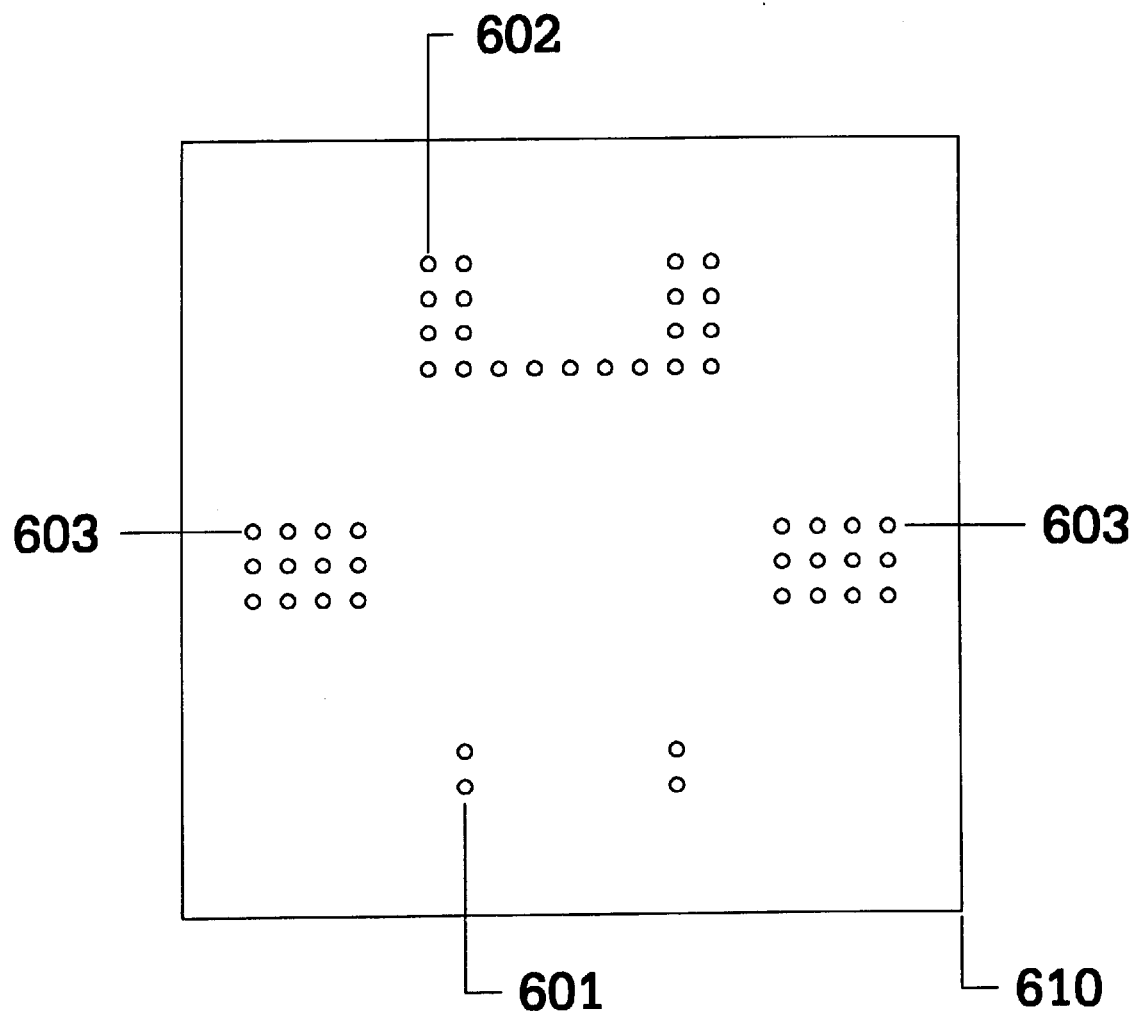
FIGS. 6a–6h show one method of preparing a power SCM.

FIG. 6a shows a ceramic substrate 610 which was used as the lid in the package for a single IRFC-150 semiconductor die. The ceramic substrate was a square, each side 8.4 mm (330 mils) long. Groups of via holes 601, 602 and 603, were drilled through the ceramic substrate in order to provide through-connections from the die side of the lid to the outside of the package. Via holes 601 were for the gate connections and via holes 602 and 603 were for the source and drain connections respectively. Each via hole was 0.15 mm (6 mils) in diameter.

Figure 6B:
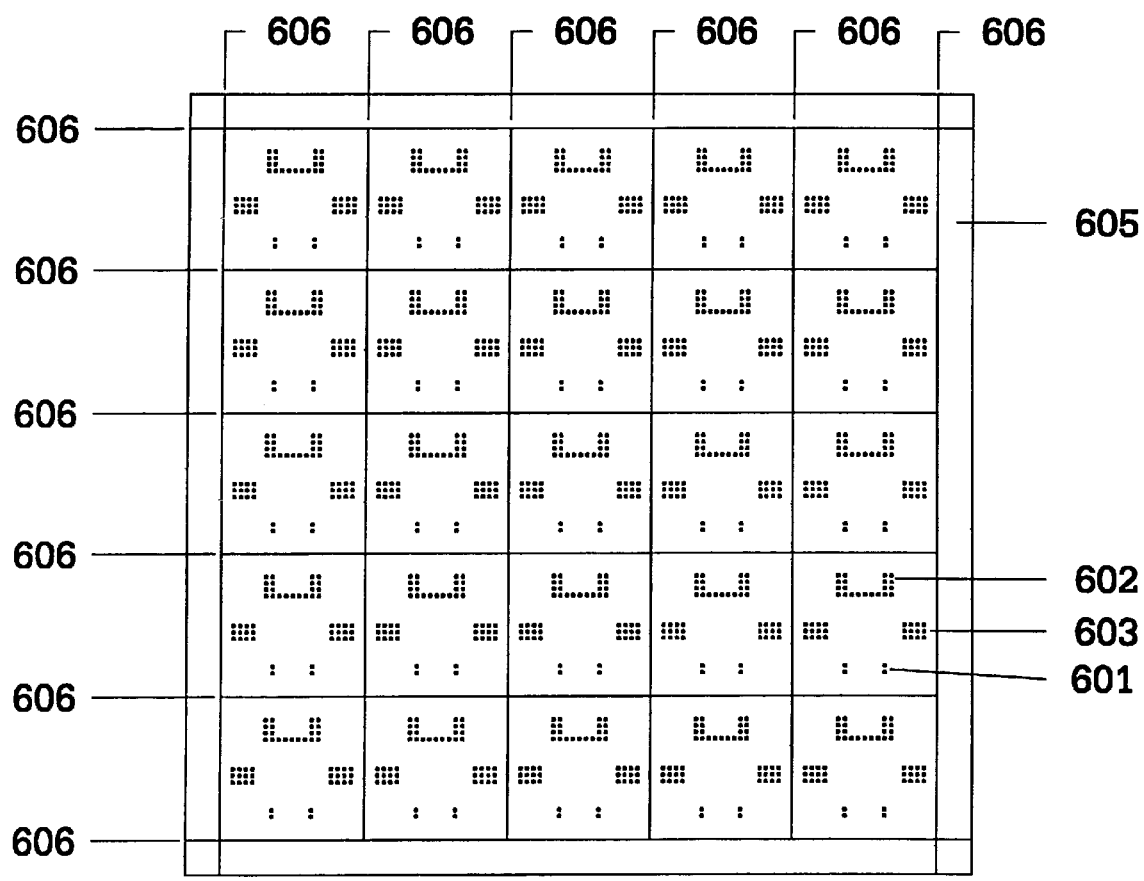

FIG. 6b shows a group of 25 ceramic substrates on a ceramic sheet 605 which was 50 mm×50 mm (2 in.×2 in.) square. The 25 ceramic substrates were processed as a unit. The ceramic sheet was scored along the lines 606 to permit individual substrates to be broken apart after processing.

The vias 601, 602 and 603 of all 25 substrates in the ceramic sheet 605 were plugged with a silver/palladium thick film paste (DuPont No. 7988™) and then fired to form through-connections in the substrates. The paste has low shrinkage upon firing and forms highly conductive feed-through connections. Any thick film paste that exhibits low shrinkage and high conductivity could be used.

Figure 6C:
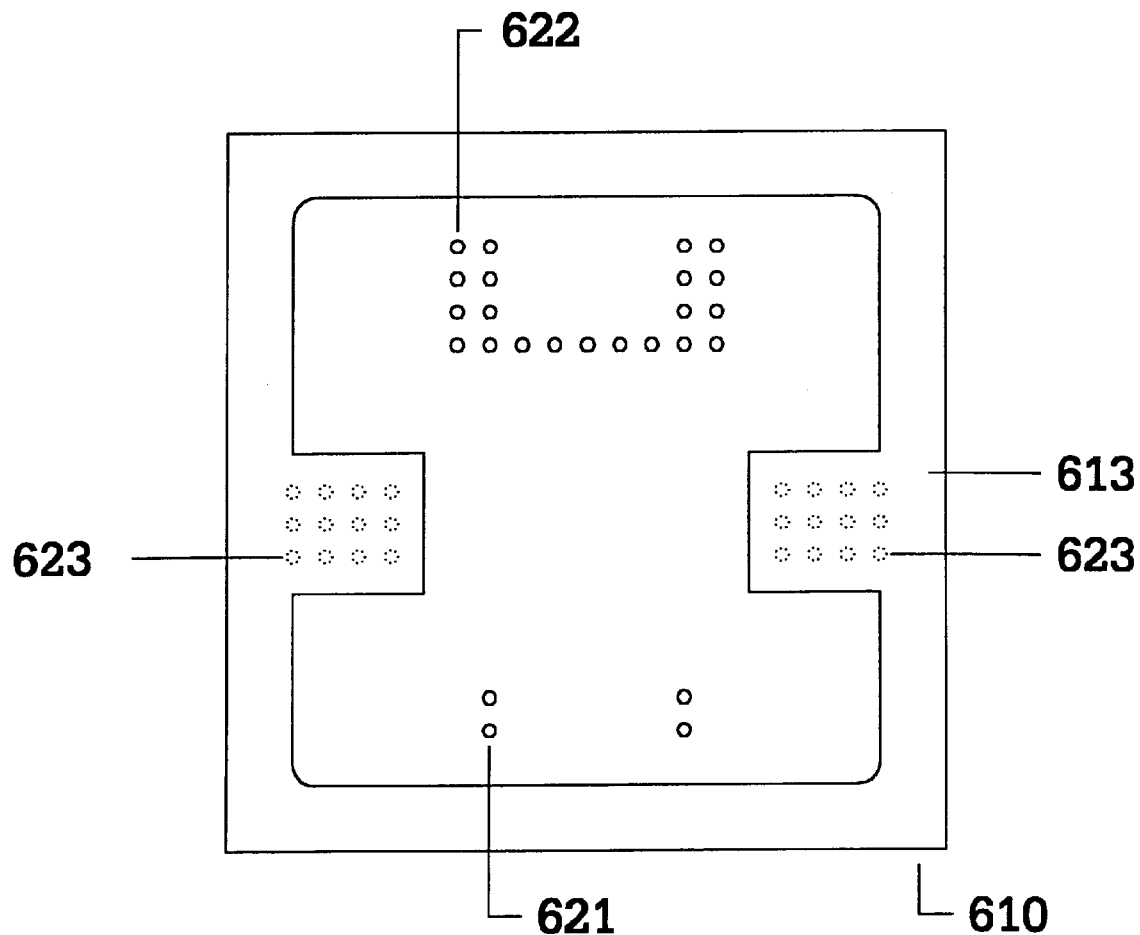

The through-connections 621 and 622 are shown in FIG. 6c. A first, thick film, conductor pattern 613 was printed and fired on one side of the ceramic substrate 610 using a platinum/silver paste. The conductor 613 covered, and was connected to, the drain through-conductors 623. Conductor 613 provided a metal layer for subsequent brazing of a frame to the ceramic substrate 610. The conductors 613 were printed simultaneously on all 25 substrates in the ceramic sheet 605 (FIG. 6b).

Figure 6D:
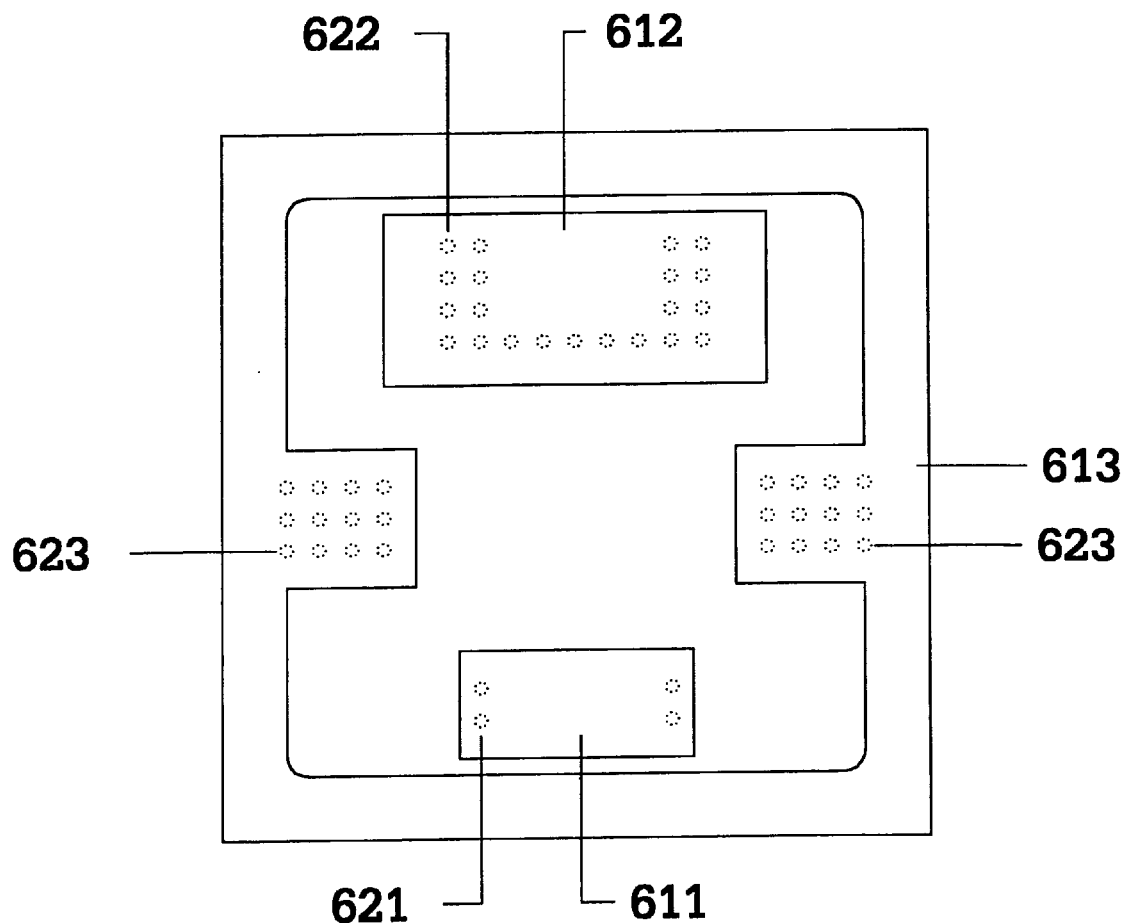
Figure 6E:
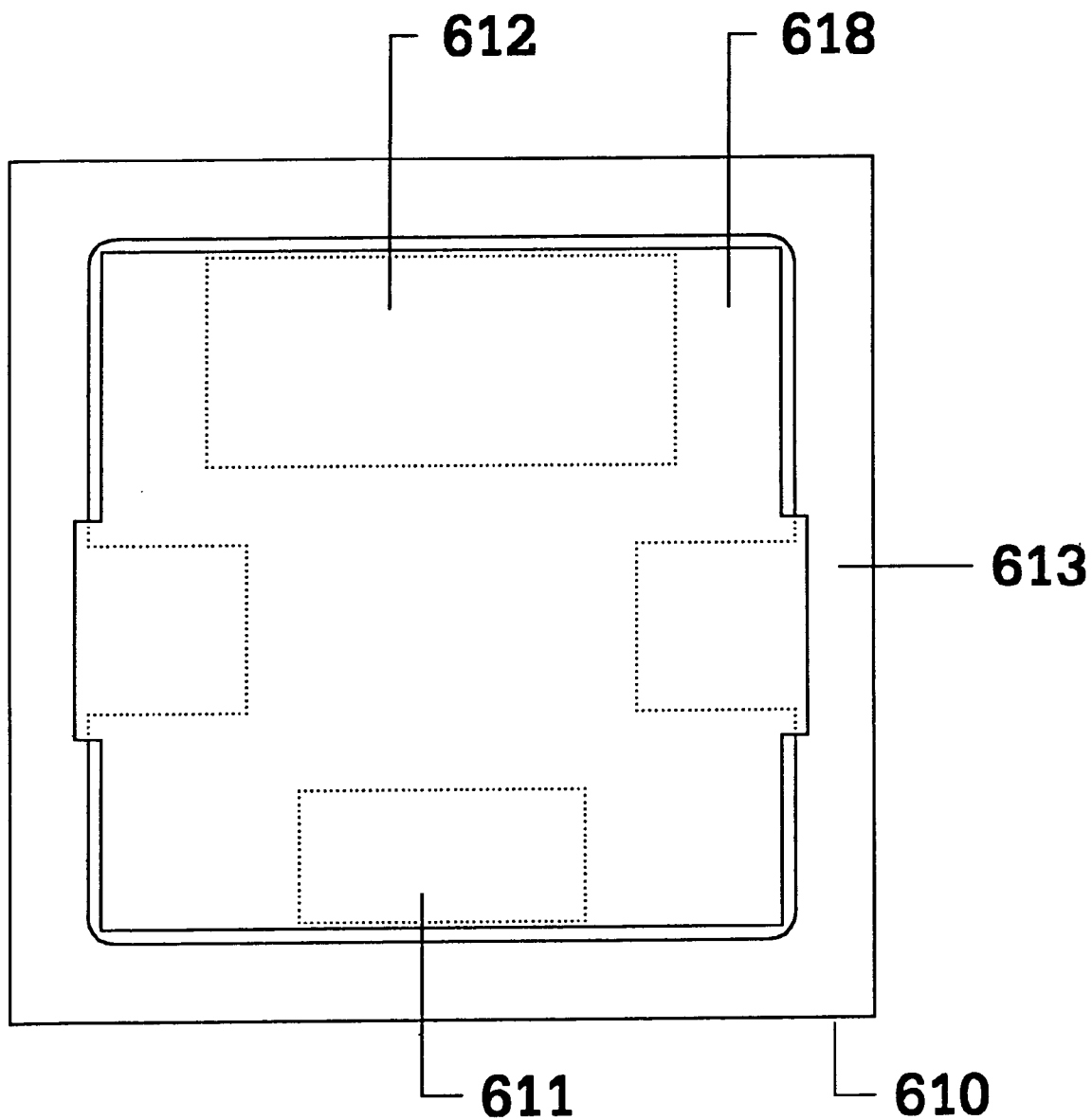

A second, thick film, conductive pattern, which is shown in FIG. 6d, was printed and fired on the same side using a gold paste. The conductor 611 was connected to the gate through-conductors 621, and the conductor 612 was joined to the source through-conductors 622. All 25 substrates in the ceramic sheet 605 were printed simultaneously. A thick film dielectric 618, shown in FIG. 6e, was applied over the gate and source conductors 611 and 612. The dielectric layer was 10–12 μm (0.4–0.5 mils) thick. Again, all 25 substrates in the ceramic sheet 605 (FIG. 6b) were printed simultaneously.

Figure 6F:
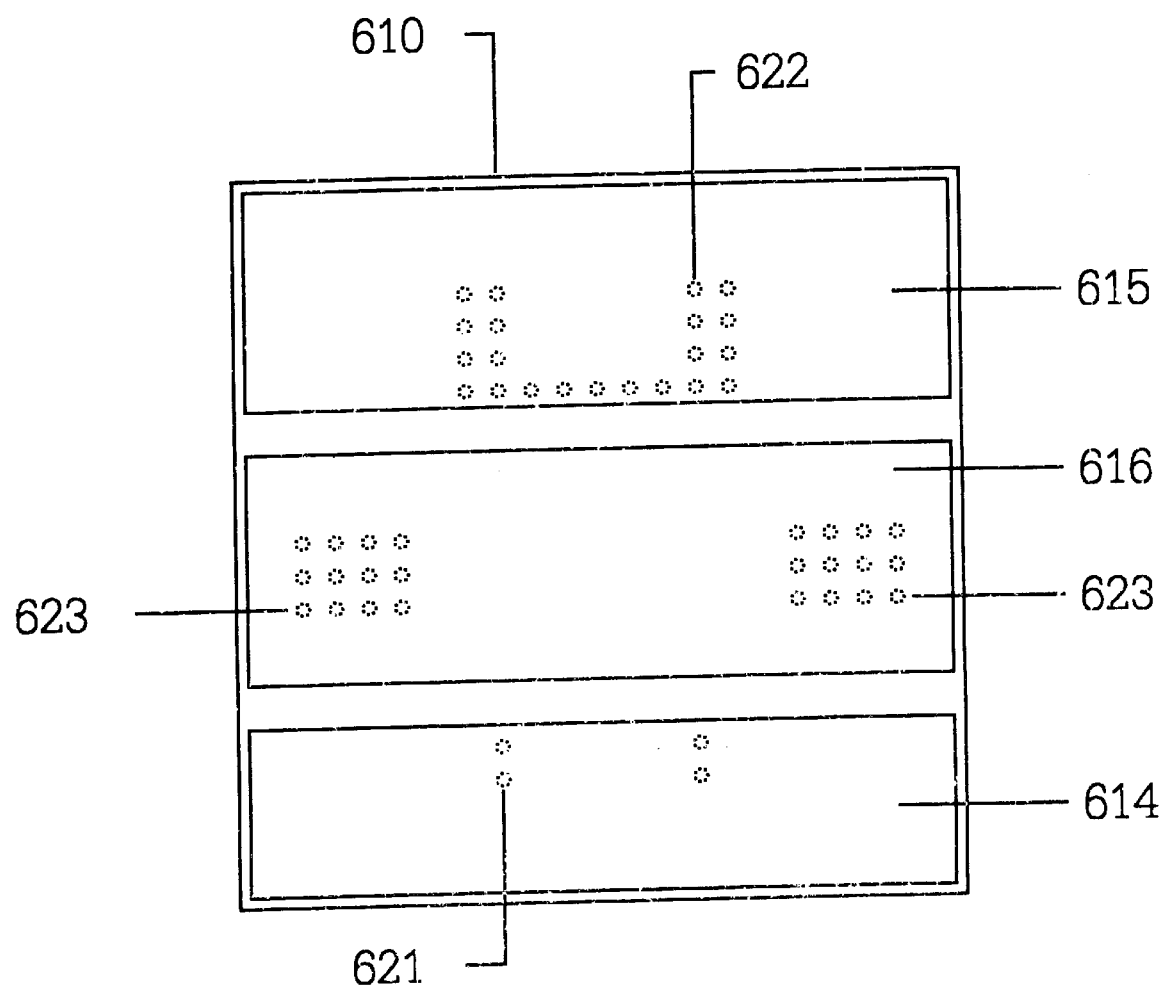
Figure 6G:
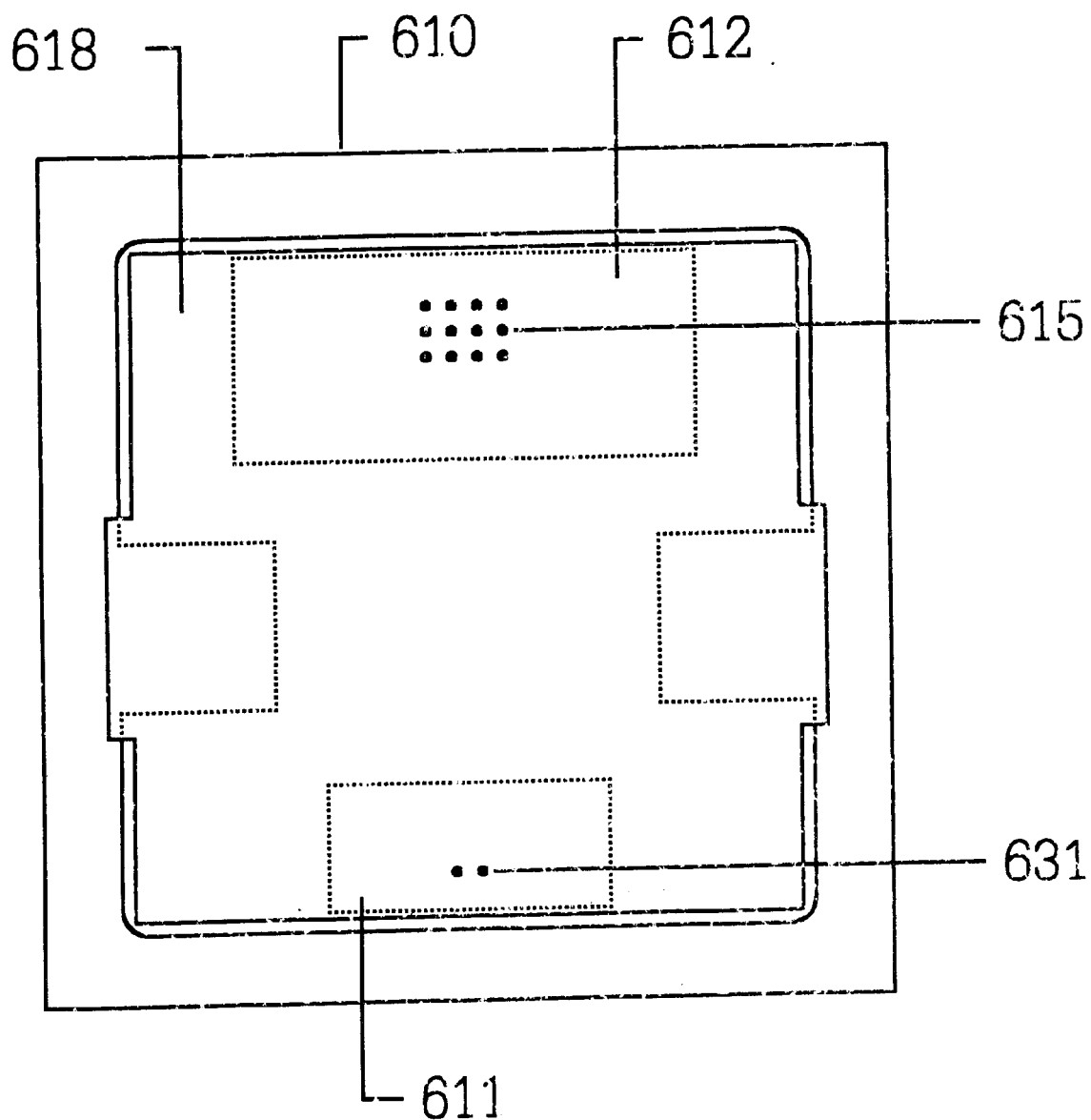

A third, thick film, conductive pattern, shown in FIG. 6f, was printed with a platinum/silver paste on the opposite side of the ceramic substrate. Again, all 25 substrates in the ceramic sheet 605 (FIG. 6b) were printed simultaneously. Conductor 614 was joined to the gate through-conductors, and conductors 615 and 616 were connected respectively to the source 622 and drain 623 through-conductors.

The conductors 614, 615, 616 and the conductor 613, around the edge of the ceramic substrate 610 on the opposite side of the lid, were masked with a temporary photoresist before gold plating. All 25 substrates in the ceramic sheet were masked simultaneously.

After masking the conductors, fifteen openings through the dielectric layer 618 to the source conductor 612 and two openings to the gate conductor 611 were made by laser ablation. A soft, ductile gold was electroplated into the openings. The gold electroplate grew from the conductors 611 and 612 through the openings and formed protuberances 631 and 632 shown in FIG. 6g. The protuberances were 45–60 μm high and protruded 37–48 μm above the dielectric layer 618. All 25 substrates in the ceramic sheet 605 were gold plated simultaneously.

After stripping the mask from the conductors 613, 614, 615 and 616 the ceramic sheet 605 was then severed along the scribed lines 606 (shown in FIG. 6b) to separate it into 25 ceramic substrates 610. Each substrate was a square having sides 8.4 mm (330 mils) long. Square frames of an iron-nickel-cobalt alloy (Kovar™) were provided which had sides 8.26 mm (325 mils) long and –0.64 mm (25 mils) high, and a wall thickness –0.5 mm (27.5 mils). The Kovar frame was brazed to the conductor 613. The frame together with the ceramic substrate to which it was attached formed a square cavity with sides 6.86 mm (270 mils) long, which was 305 μm (12 mils) larger than the IRFC-150 die.

An IRFC-150 die, with the base (i.e. the drain) down, was put on a square, gold plated molybdenum base or tab; and the die was brazed to the molybdenum in a hydrogen furnace. The molybdenum was 0.8 mm (20 mils) thick and the sides were 6.65 mm (262 mils), which was 100 μm (4 mils) longer than the die.

Figure 6H:
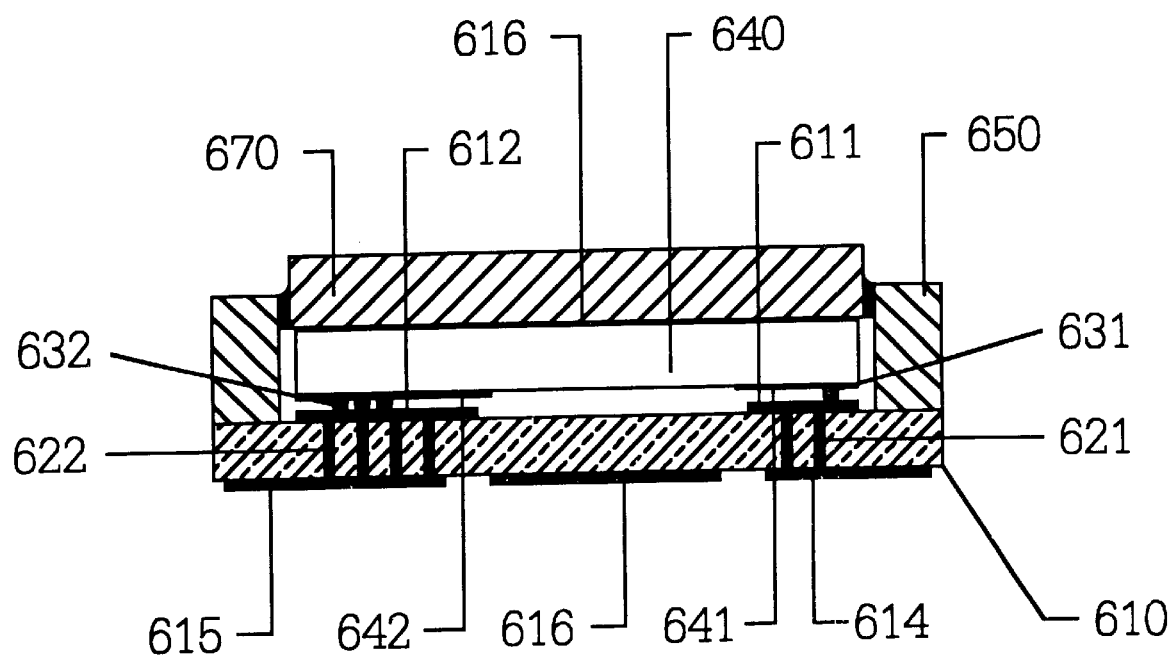

Referring to FIG. 6h, the die 640 on the molybdenum base 670 was placed into the cavity formed by the frame 650 and the ceramic substrate 610. Heat and pressure were applied. The gold protuberances were soft and ductile enough to adjust themselves for height differences from one to another; and a thermocompression bond was formed between the source pad 642 and gate pad 641 of the IRFC-150 die and the gold protuberances 632 and 631. In this method of manufacturing the package there is no height tolerance because the molybdenum tab is inside the wall of the frame and is self adjusting for height. While maintaining heat and pressure, the molybdenum tab was soldered to the Kovar frame. The package was then cooled while continuing to maintain the compression pressure.

FIG. 6h is a view of the assembled package in cross section. The gate 641 of the die has been thermocompression bonded to the gold protuberances 631, and connected through the protuberances to the conductor 611, and by the through-connections 621 to the gate pad of the package 614. The source contact of the die 642 is similarly connected through protuberances 632, conductor 612, and through-connections 622 to the source pad of the package 615. The drain of the die is connected to the molybdenum base 670, through the molybdenum to the Kovar frame 650, through the Kovar frame to the conductor 613, and by the through-connections 623 (see FIG. 6a) to the drain pad of the package 616. In addition to serving as the drain connection to the die, the molybdenum base is a thermal path for removing heat from the package.

The finished power package was tested and found to be fully functional. The package was very compact. The overall size of the package was only 8.4 mm (330 mils) in length and breadth and 1.1 mm high. Including the molybdenum base, it weighed 0.45 g. For comparison the conventional package, IRFP150™, (including its heat tab) is 21 mm (825 mils) long, 14 mm (550 mils) wide and 0.5 mm (20 mils) high; and it weighs 5.15 g.

In addition to the procedure described above, the ceramic package could be produced by alternative procedures such as cofired ceramic techniques. The feed-through connections may be prepared by making through-holes 601, 602 and 603 (FIG. 6a) in a green ceramic and plugging the holes with a refractory metal paste before firing. Likewise the drain 616, source 615 and gate 614 contacts of the package shown in FIG. 6d, and the conductive pattern of FIG. 6f may be printed with refractory pastes on the green ceramic before firing. Even the dielectric layer 618 (FIG. 6e) could be applied to the green ceramic before firing, or the dielectric layer 618 with the openings to the gate and source conductors 614 and 615 could be made with a photoprintable ceramic dielectric. Also the ceramic base could be prepared by thin film techniques. The ceramic base with source and gate contacts may also be prepared by a mixture of co-fired and thick film or thin film techniques.

In those power semiconductors that operate at very high voltage, there is a possibility for a short circuit between the power contact pad of the chip and the metal frame connected through the base to the back of the chip. Use of a ceramic frame instead of the metal frame increases the insulation between the positive and negative contacts of the chip. It is especially advantageous to use green ceramics to form both the cofired lid and the ceramic frame as a single unit to obtain the maximum insulation in the smallest volume. When a insulating frame is used, or a ceramic frame is incorporated in the lid, it is more convenient to make one electrical connection on one side of the package, and the other connections on the opposite side of the package.

Figure 6I:
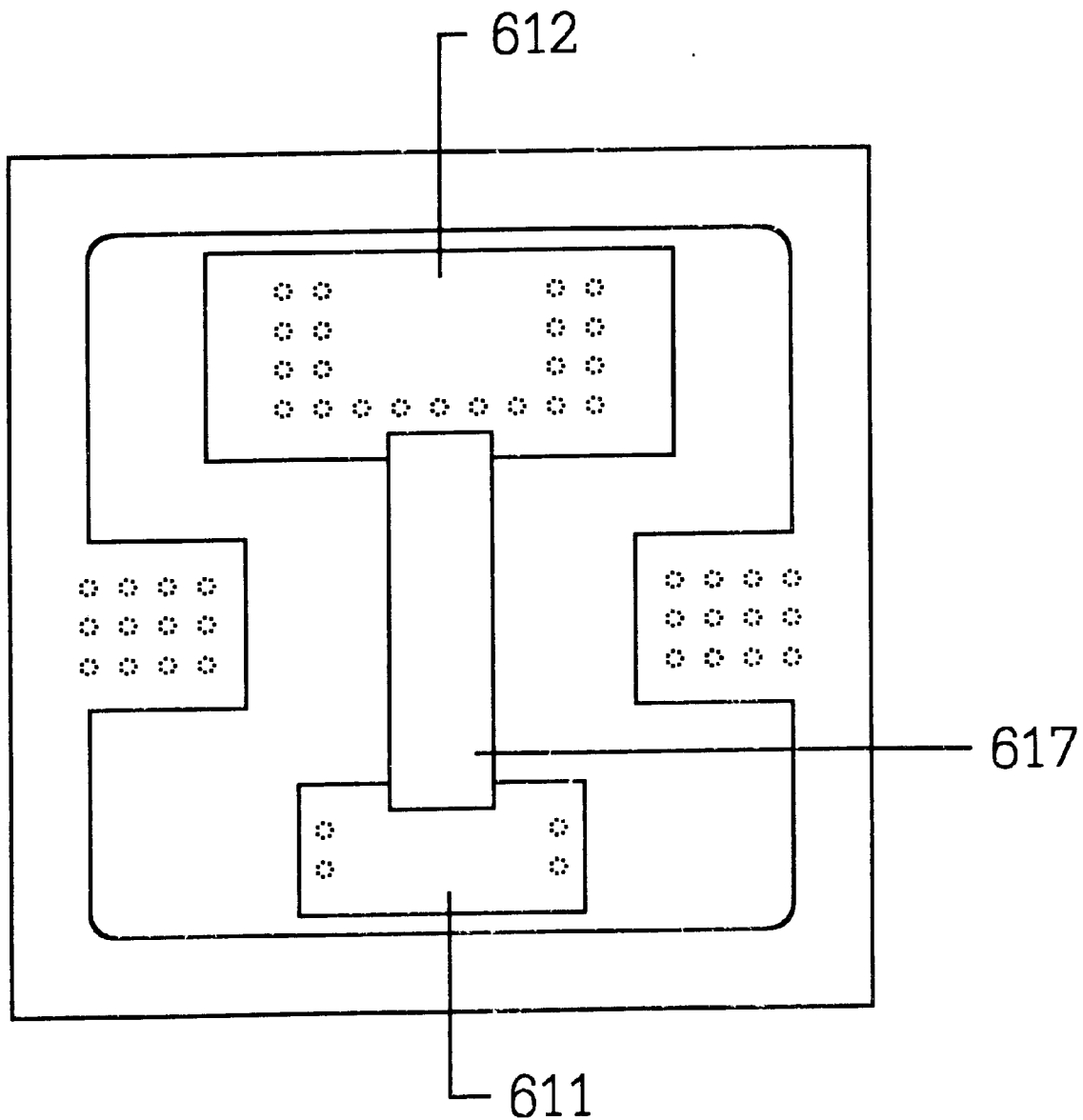
FIG. 6i shows electrostatic discharge protection in the power SCM.

To prevent electrostatic discharge (ESD) damage to power FETs, when power semiconductors packages are mounted on a higher level package an external high value resistor is connected across the source and gate contacts of the package. In another embodiment of the power FET chip carrier package of the present invention, ESD protection is easily incorporated. This may be illustrated by referring to FIG. 6i where a high value thick film resistor 617 is shown as printed between the gate conductor 611 and source conductor 612 to provide ESD protection.

Power module packages containing a plurality of power semiconductor devices also are easily manufactured by the procedures described above. The power module package can be an array of independent power semiconductor devices, an array of interconnected devices, or a mixture of independent and interconnected devices.

Figure 7A:
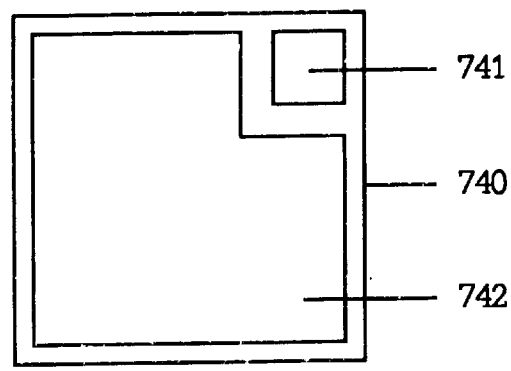
FIGS. 7a–7g illustrate the preparation of an MCM package with a plurality of power devices.

One method of preparing a package for a plurality of power semiconductors is shown in FIGS. 7a–7g. FIG. 7a shows a top view of an SCR die 740 which has dimensions of 6.88 mm by 6.88 mm (0.270 mils×0.270 mils). The die has a gate contact pad 741 and an anode contact pad 742. The cathode contact is on the reverse side of the die. The cathode contact of the die is then brazed to a copper/tungsten alloy base which is 7 mm by 7 mm (0.276 mils×0.276 mils).

Figure 7D:
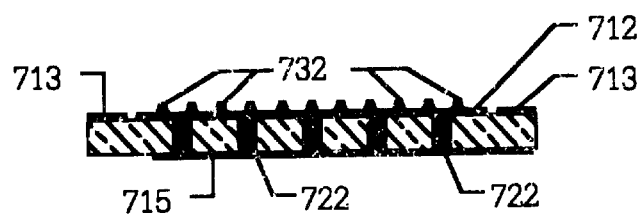
Figure 7E:
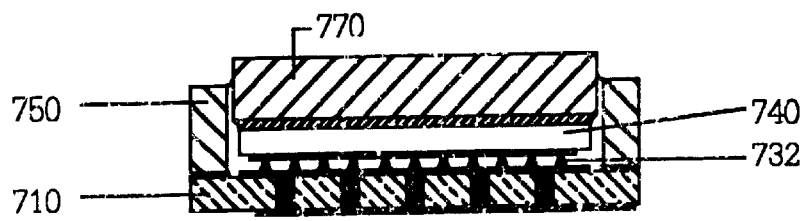
Figure 7G:
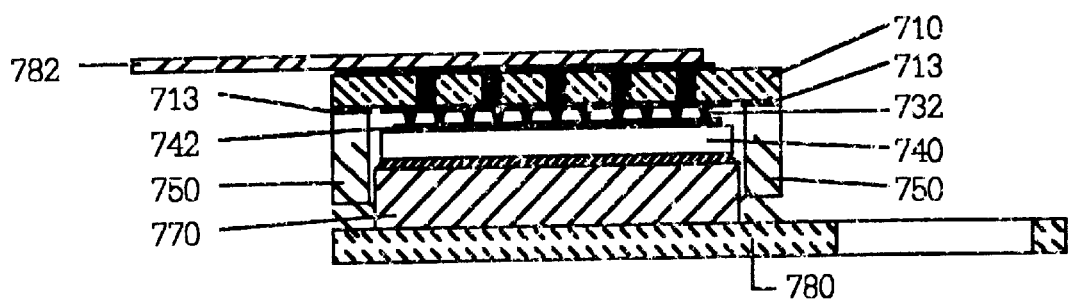
Figure 7B:
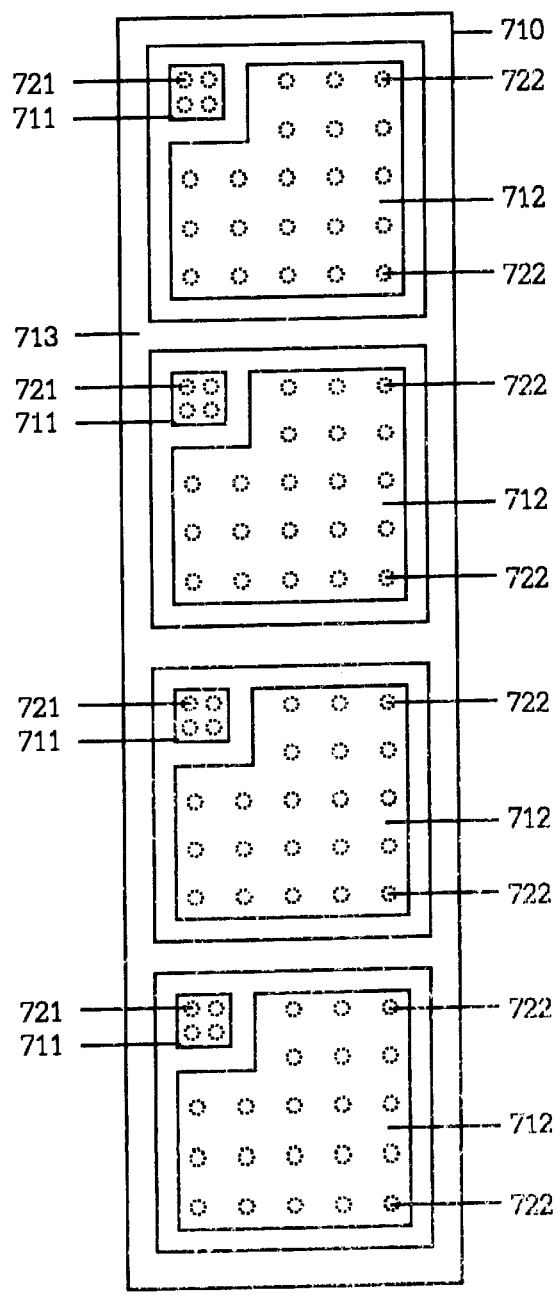
Figure 7C:
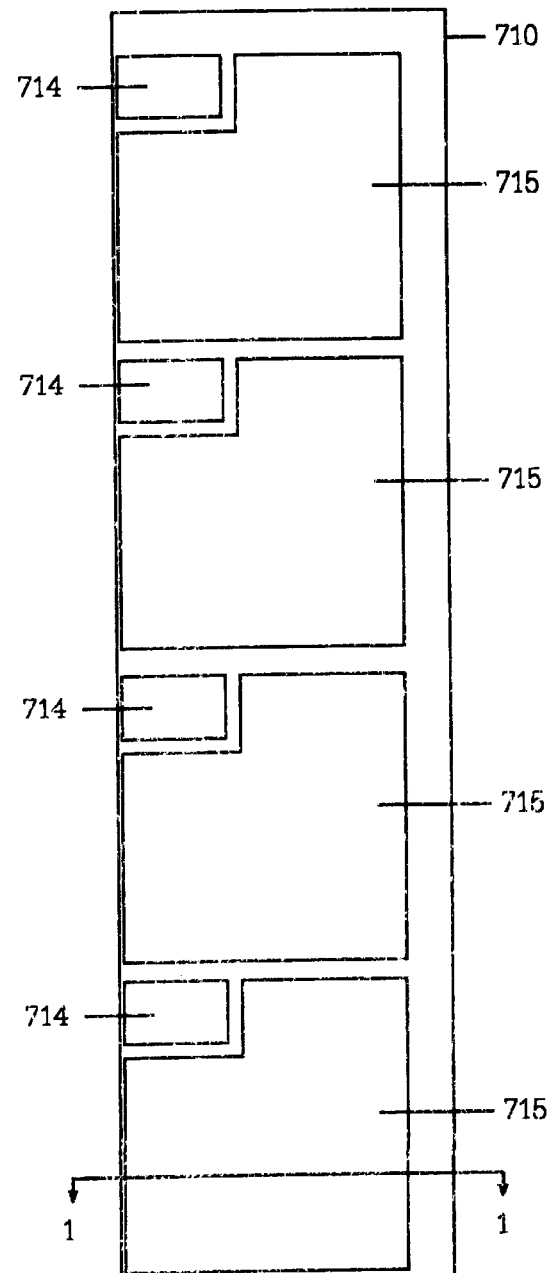

FIG. 7b is a view of the bottom of a ceramic lid 710 which is 9.4 mm by 38 mm (0.37 inch by 1.5 inch). The bottom of the lid is provided with thick film conductors 711 and 712 which are connected to plugged vias 721 and 722, and thick film metallization 713 surrounding the conductors 711 and 712. The top side of the lid 710 is shown in FIG. 7c, and has a conductive pattern layer with conductors 714 and 715 which are connected to the bottom conductive pattern layer by the plugged vias.

A plating resist is printed over the conductive pattern layers of the lid. The printed resist completely covers the top side conductors 714 and 715, and leaves a pattern of openings over the conductors 711 and 712. A soft, ductile gold is electroplated into the openings. FIG. 7d shows a cross section of the lid along line 1—1 after the resist is stripped. The conductor 712 is joined to the conductor 715 by the metal filled vias 722. The soft, ductile gold deposits form protuberances 732 above conductor 712 of the conductive pattern layer as well as the protuberances above conductor 711 (FIG. 7b) which are not shown in the cross section. The number, size and distribution of the openings across the surface of the conductors is sufficient to minimize the contact resistance and maximize the power distribution in the SCR die when the lid is bonded to the die. The size of the printed openings and plated protuberances is sufficient to form reliable metallurgical bonds to the contact pads of the die, but the protuberances are not so large that the bonding pressure required for reliable metallurgical bonding by thermocompression, thermosonic or ultrasonic bonding could damage the die.

After the protuberances have been formed a Kovar frame is brazed to the conductor 713. The inside dimensions of the frame are 0.3 mm (12 mils) larger than the copper/tungsten tab. As shown in FIG. 7e, the die 740 on the copper/tungsten tab 770 is slipped inside the frame 750 and thermocompression bonded to the gold protuberances 732 on the lid 710. Then the frame is brazed to the copper/tungsten base.

Figure 7F:
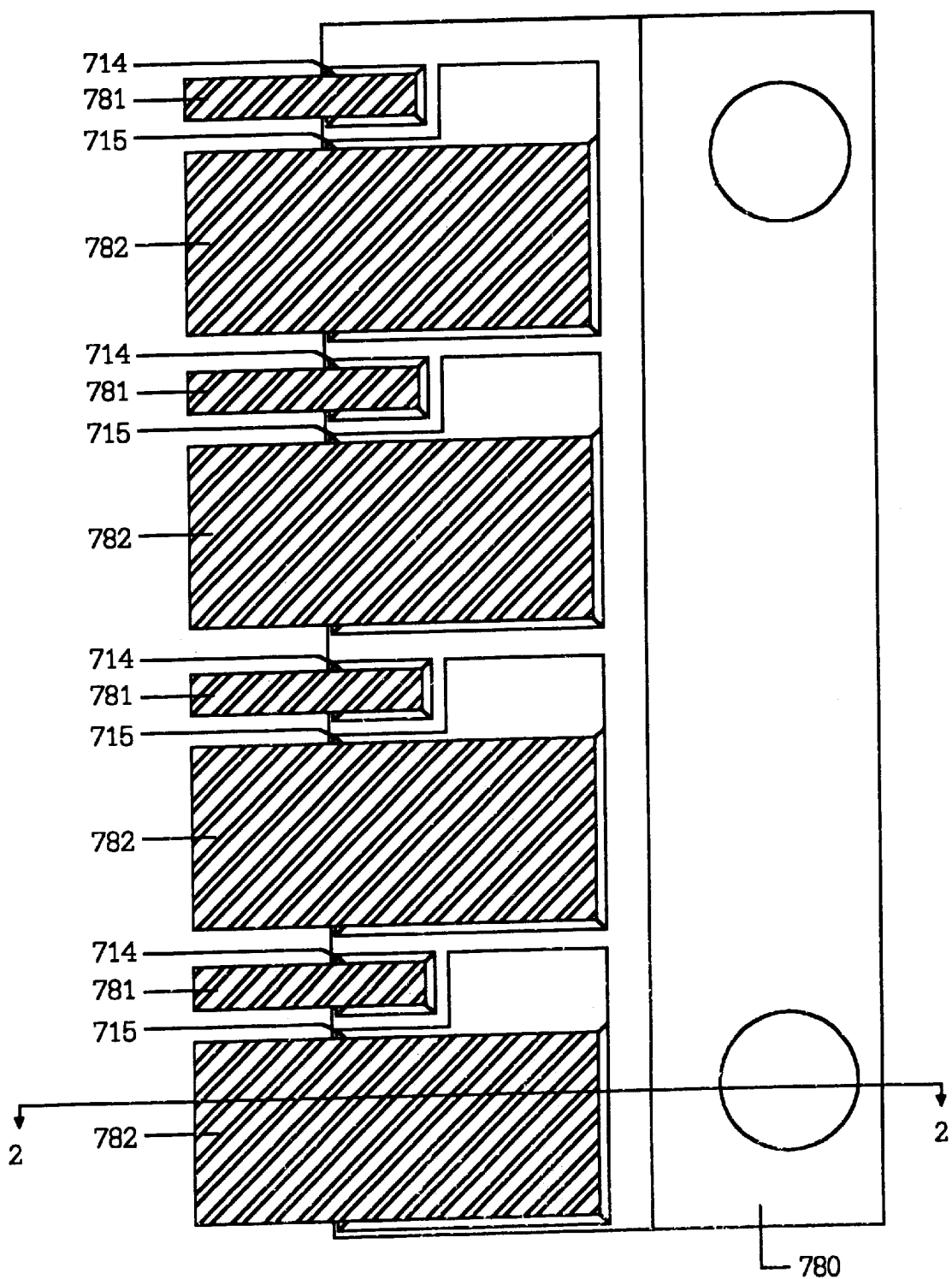

FIG. 7f is the top view of the package containing four SCR dice on a mounted on common conductor 780. The conductor 780 connects all the cathodes together and serves as a thermal path for connection to a heat sink. Four copper alloy leads 781 which are soldered to the conductors 714 serve as the gate contacts of the package, and the four copper alloy leads 782 soldered to conductors 715 are the anode contacts.

FIG. 7g is a cross section view along line 2—2. The cathodes of the dice 740 are bonded to the copper/tungsten bases 770 which conduct heat and electricity to the bottom conductor 780. The anode contacts 742 and the gate contacts (not shown) are metallurgically bonded to the protuberances 732 for anode connections and to the protuberances for gate connections (not shown), and through the lid for connections to the copper alloy leads 782 and 781 (FIG. 7f). The frames 750 are brazed to the conductors 713 surrounding each die.

This compact unit contains four silicon controlled rectifiers (SCRs) in a package only 20 mm (0.8 inch) wide and 40 mm (1.5 inch) long.

Figure 8A:
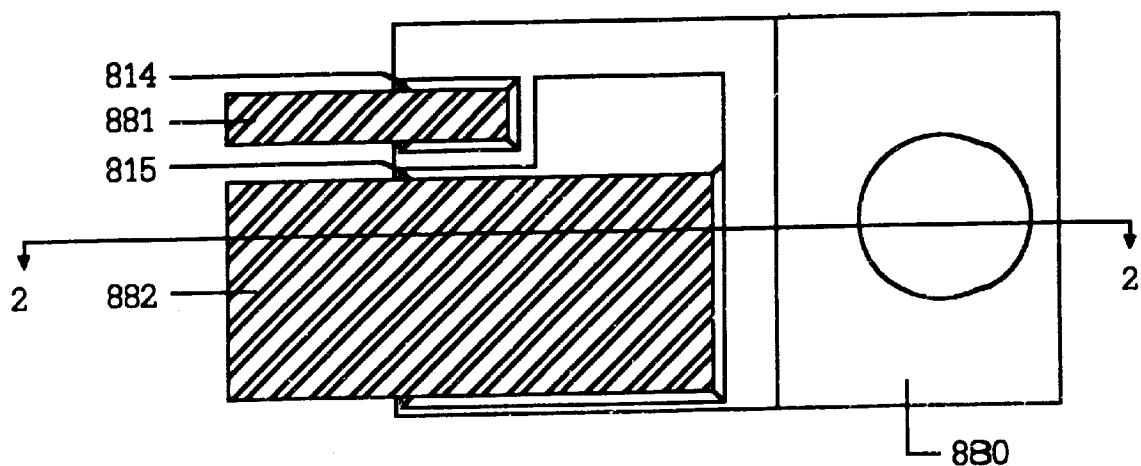
FIGS. 8a–8b illustrate an MCM package with two power semiconductors connected back to back.
Figure 8B:
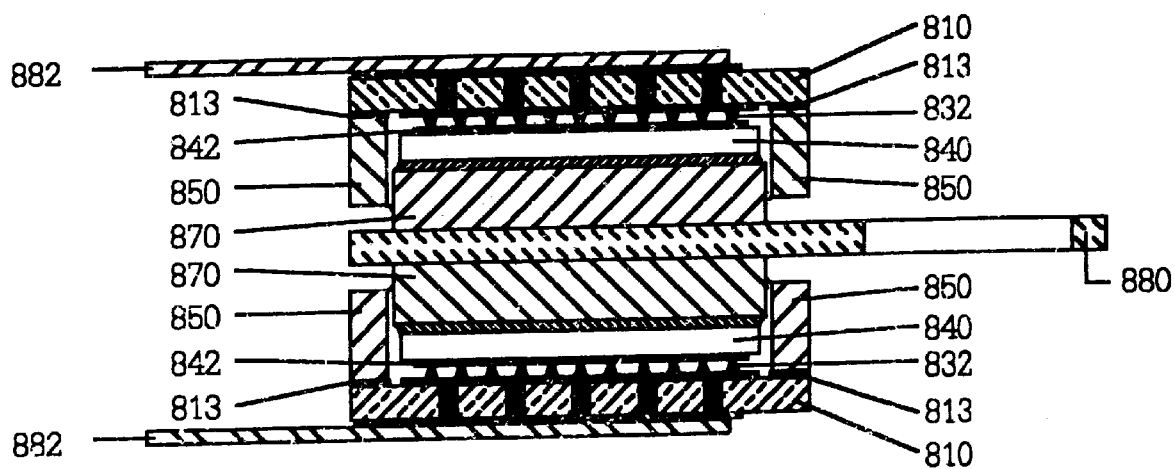

Another package for a plurality of power semiconductors is shown in FIGS. 8a and 8b. The package is prepared by techniques similar to those described above in reference to FIGS. 7a–7g, and similar features have similar identifying numbers. The package has two power semiconductors mounted on the opposite sides of a metal lead. FIG. 8a shows a top view of the package. The lid 870 has metal lead 881 bonded to the gate conductor 814, and metal lead 882 bonded to the anode conductor 815. The end of the cathode metal lead 880 projects from underneath the lid.

FIG. 8b is a cross section view along line 3—3 of FIG. 8b. The cathodes of the upper and lower chips 840 are bonded to copper/tungsten bases 870 on opposite sides of the metallic lead 880. The anode metallization of the semiconductor 842 and the gate metallization (not shown) are metallurgically bonded to the protuberances 832 for anode connections and to protuberances for gate connections (not shown), and through the two lids 810 for connections to the metallic leads 882 and 881 (FIG. 8a). The frames 850 are brazed to the conductors 813 surrounding each die.

This package provides a double power semiconductor package in a minimum amount of space. In this package two power semiconductors on thermally conductive bases are mounted on opposing sides of a common conductor with the two lids on the outside of the package. A similar package may be prepared with two power semiconductors being mounted on opposing sides of a common lid with the two bases on the outside of the package.

Figure 9:
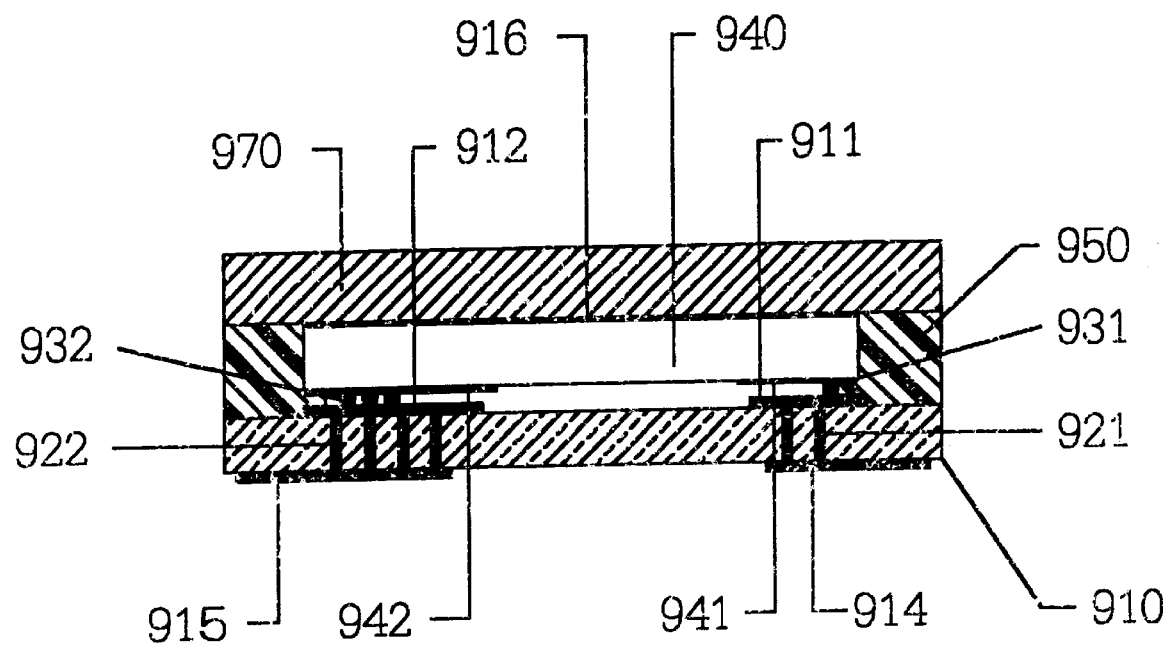
FIG. 9 shows a SCM package with a molded plastic frame.

FIG. 9 shows a package utilizing a molded plastic frame. A power semiconductor 940 is bonded to a metallic base 970. The source 942 and gate 941 metallization of the die is thermocompression bonded to the soft, ductile metal protuberances 932 and 931 on the conductors 912 and 911 of the lid 910. The through-connections 922 and 921 in the lid connect the source and gate of the semiconductor to the source 942 and gate 941 pads of the package. To enclose and seal the package a plastic frame 950 is molded between the base and the lid.

It will be obvious to those skilled in the art that the packages and packaging techniques described herein can be applied not only to a die containing a single power semiconductor, but also to a die containing more than one power semiconductor. These packages and packaging techniques also can be applied to packages containing one or more power semiconductors and the device controlling the power devices.

I claim:

1. A package for a semiconductor chip having at least one semiconductor device, wherein a first surface of the chip is bonded to a base, the base being attached to a frame, and the frame attached to a lid to enclose the chip, the chip having at least one contact pad on its second surface, characterized in that:

the lid comprises a rigid, planar, insulating substrate having a conductive pattern at least on a first surface facing the chip, the conductive pattern of the lid being electrically connected to the chip through soft, ductile, metal protuberances between the chip and the lid, the number of protuberances connected to a contact pad being sufficient to minimize the contact resistance and the power lost as heat ($I^2R$) between the chip and the lid, and minimize the current density on the surface of the chip.

2. A package according to claim 1 further characterized that the conductive pattern layer on the surface of the lid facing the chip is at least partially covered by an insulating layer, and the protuberances connect to the conductive pattern layer through openings in the insulating layer.

3. A package according to claim 1 wherein the protuberances are a soft, ductile gold.

4. A packaging module for a plurality of semiconductor devices comprising:

a plurality of semiconductor chips, each chip having at least one semiconductor device, a first surface of each chip being bonded to a base, and each chip having at least one contact pad on a second surface;

a common lid being a rigid, planar, insulating substrate;

a plurality of frames being bonded to the common lid;

a conductive pattern on the lid, the conductive pattern being metallurgically bonded by metal protuberances to each of the contact pads on second surfaces of the plurality of chips, the number of protuberances connected to a contact pad being sufficient to minimize the contact resistance and the power lost as heat ($I^2R$) between the chip and the lid, and minimize the current density on the surface of the chip, and each chip being surrounded by a frame, the frame around each chip being bonded to the base supporting the chip.

5. A packaging module according to claim 4, wherein the conductive pattern on the lid also comprises at least one conductive pattern layer on the second surface of the lid adapted for input/output connections for the module; the conductive pattern of the lid including connections between the first and second surfaces.

6. A packaging module according to claim 4, wherein each chip is individually enclosed.

7. A packaging module according to claim 4, wherein at least some of the semiconductor devices are interconnected by the conductive pattern on the lid.

8. A packaging module according to claim 4, wherein the frames are one unit comprising an openwork, lattice structure.

9. A packaging module according to claim 4 wherein the frames and bases are comprised of metal and electrically connect all the first surfaces of the devices together.

10. A package according to claim 1, wherein the semiconductor chip comprises a plurality of semiconductor devices connected to the conductive pattern of the lid by the soft, ductile, metal protuberances.

11. A package according to claim 1, wherein the lid comprises a hybrid circuit.

12. A package according to claim 10, wherein the conductive pattern of the lid interconnects more than one active device.

13. A package according to claim 1 wherein the conductive pattern of the lid also comprises passive components.

14. A package according to claim 13 wherein the passive components comprise a deposited resistor on the lid to provide electrostatic discharge (ESD) protection.

15. A package according to claim 1 wherein the conductive pattern of the lid also comprises at least one conductive pattern layer on a second surface of the lid.

16. A package according to claim 15 wherein the conductive pattern layer on the second surface of the lid, away from the chip is connected to the conductive pattern layer on the first surface of the lid.

17. A package according to claim 1 wherein the rigid, planar, insulating substrate further comprises an insulating frame.

18. A package according to claim 17 wherein the rigid, planar, insulating substrate and the insulating frame comprise ceramic materials.

19. A package according to claim 1 wherein the package enclosing the chip is hermetically sealed.

20. A package according to claim 1 wherein the frame and the base are comprised of metal and are capable of electrically connecting the first surface of the chip to the conductive pattern of the lid.

21. A package according to claim 20 wherein the chip is a power semiconductor device; the package is hermetically sealed; and the lid comprises a ceramic insulating material having a conductive pattern of electrically interconnected conductive pattern layers on the first and second surface of the lid.

22. A packaging module according to claim 4, wherein at least one semiconductor chip contains a plurality of semiconductor devices.

23. A packaging module according to claim 4, wherein the lid comprises a hybrid circuit.

24. A packaging module according to claim 23, wherein the conductive pattern of the lid connects more than one active device.

25. A packaging module according to claim 4 wherein the conductive pattern of the lid also comprises passive components.

26. A packaging module according to claim 25 wherein the passive components comprise a deposited resistor on the lid to provide electrostatic discharge (ESD) protection.

27. A packaging module according to claim 4 wherein the conductive pattern of the lid comprises at least one conductive pattern layer on a second surface of the lid away from the chip.

28. A packaging module according to claim 27 wherein the conductive pattern layer on the second surface of the lid away from the chip is connected to the conductive pattern layer on the first surface of the lid.

29. A packaging module according to claim 28 wherein the conductive pattern of the lid comprises at least one conductive pattern layer on a second surface of the lid away from the chip, the conductive pattern layer being connected to the conductive pattern layer facing the chip by means of plugged conductive vias.

30. A packaging module according to claim 29, wherein the conductive pattern layer on the second surface of the lid comprises a gird array suitable for connecting to a higher level assembly.

31. A packaging module according to claim 4 wherein the rigid, planar, insulating substrate further comprises an insulating frame.

32. A packaging module according to claim 31 wherein the rigid, planar, insulating substrate and the insulating frame comprise ceramic materials.

33. A packaging module according to claim 4 wherein the package enclosing the chips is hermetically sealed.

34. A packaging module according to claim 4 wherein the frames and the bases are comprised of metal and are capable of electrically connecting the first surfaces of the chips to the conductive pattern of the lid.

35. A package according to claim 16 wherein the conductive pattern of the lid comprises at least one conductive pattern layer on a second surface of the lid away from the chip, the conductive pattern layer being connected to the conductive pattern layer facing the chip by means of plugged conductive vias.

36. A package according to claim 35, wherein the conductive pattern layer on the second surface of the lid comprises a gird array suitable for connecting to a higher level assembly.

* * * * *